(12) United States Patent
Morikawa et al.

(10) Patent No.: US 7,116,579 B2
(45) Date of Patent: Oct. 3, 2006

(54) SEMICONDUCTOR STORAGE DEVICE AND MOBILE ELECTRONIC APPARATUS

(75) Inventors: Yoshinao Morikawa, Ikoma (JP); Masaru Nawaki, Nara (JP); Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 109 days.

(21) Appl. No.: 10/851,517

(22) Filed: May 20, 2004

(65) Prior Publication Data
US 2004/0257878 A1 Dec. 23, 2004

(30) Foreign Application Priority Data
May 20, 2003 (JP) .............................. 2003-142509

(51) Int. Cl.
G11C 11/34 (2006.01)
(52) U.S. Cl. ............................ 365/185.14; 365/185.18; 365/189.01; 365/185.03; 257/314
(58) Field of Classification Search .......... 365/189.01, 365/204, 185.14, 185.18, 185.03; 257/314
See application file for complete search history.

(56) References Cited

U.S. PATENT DOCUMENTS

| 5,224,070 A | 6/1993 | Fandrich et al. |
| 5,729,035 A * | 3/1998 | Anma ......................... 257/324 |
| 5,838,041 A | 11/1998 | Sakagami et al. |
| 5,929,480 A | 7/1999 | Hisamune |
| 6,043,528 A * | 3/2000 | Aoki et al. .................. 257/301 |
| 6,928,152 B1 * | 8/2005 | Takeda et al. .......... 379/207.02 |
| 6,982,906 B1 * | 1/2006 | Matsuoka et al. ..... 365/185.19 |
| 7,050,337 B1 * | 5/2006 | Iwase et al. ........... 365/189.05 |
| 7,061,808 B1 * | 6/2006 | Yaoi et al. ............. 365/185.19 |
| 2001/0034085 A1 * | 10/2001 | Nakayama et al. ......... 438/140 |
| 2003/0164517 A1 | 9/2003 | Kamei et al. |
| 2004/0004863 A1 * | 1/2004 | Wang ........................ 365/199 |

FOREIGN PATENT DOCUMENTS

JP 05-304277 11/1993

* cited by examiner

*Primary Examiner*—Richard Elms
*Assistant Examiner*—Eric J. Wendler
(74) *Attorney, Agent, or Firm*—Morrison & Foerster LLP

(57) ABSTRACT

A semiconductor storage device is provided, which comprises a memory array comprising memory elements, a write state machine for performing a sequence of a program or erase operation with respect to the memory array, a decoder for decoding a signal indicating a current state of the write state machine, which is output from the write state machine, and outputting a status signal indicating a status of the program or erase operation with respect to the memory array, a status register for storing the status signal, and an output circuit for outputting the status signal stored in the status register. Each memory element comprises a gate electrode, a channel region, diffusion regions, and memory function sections provided on opposite sides of the gate electrode and having a function of retaining charges.

12 Claims, 21 Drawing Sheets

FIG.2
(a)
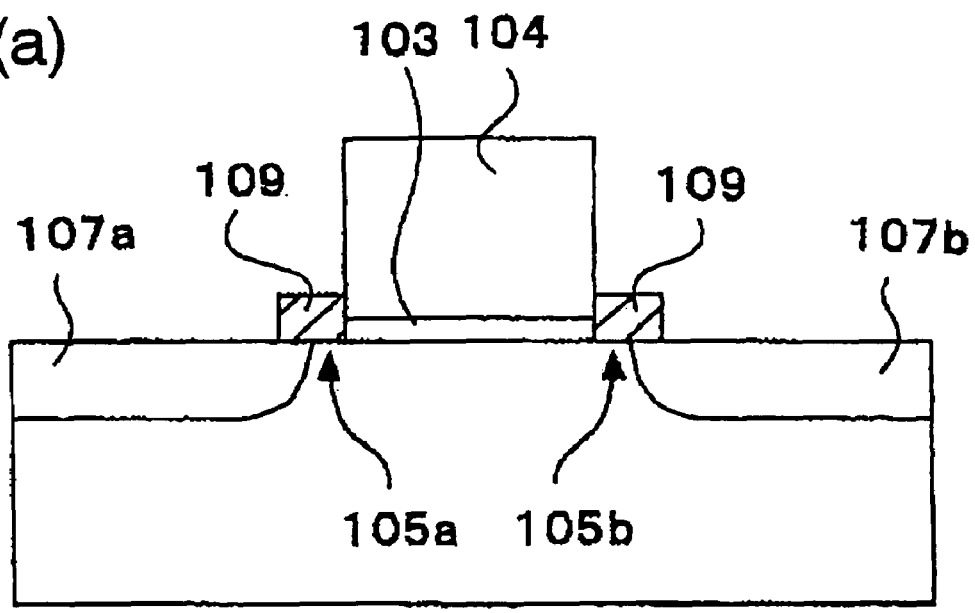
(b)
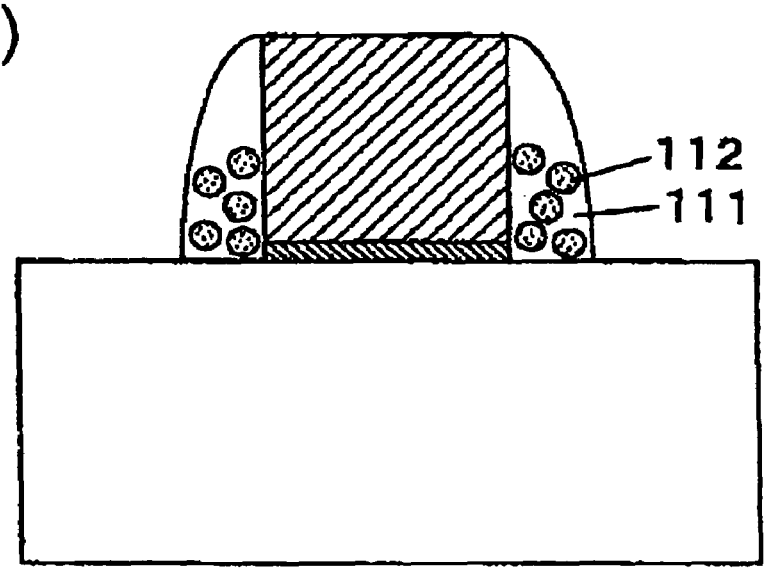

FIG.21
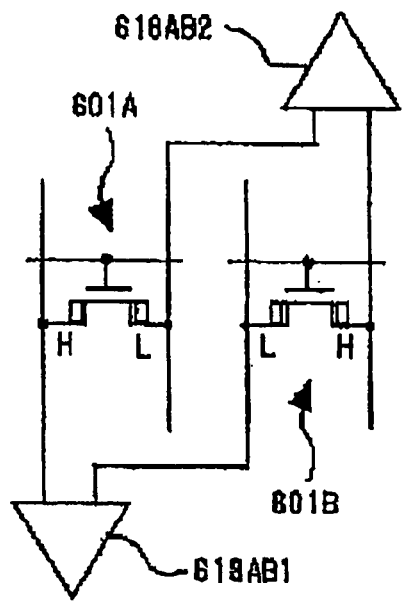
(a)
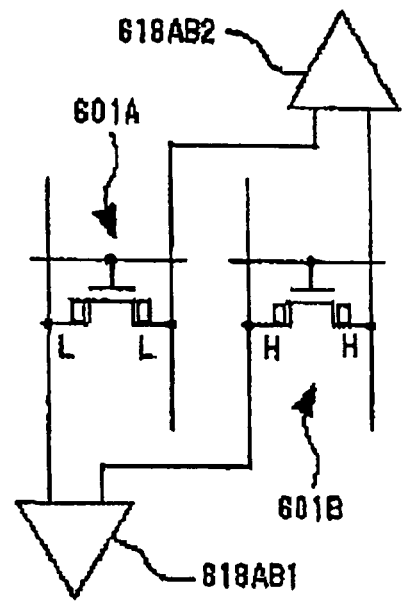
(b)
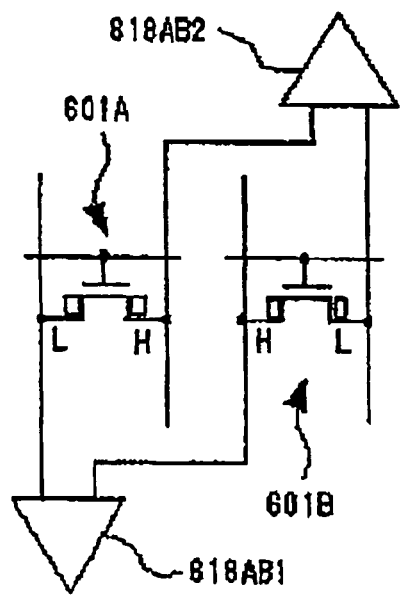
(c)
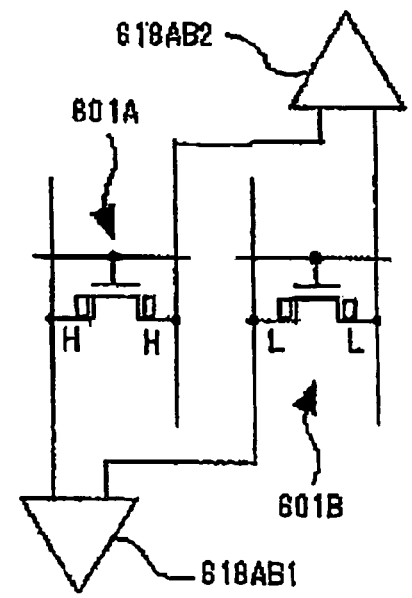
(d)

FIG.22
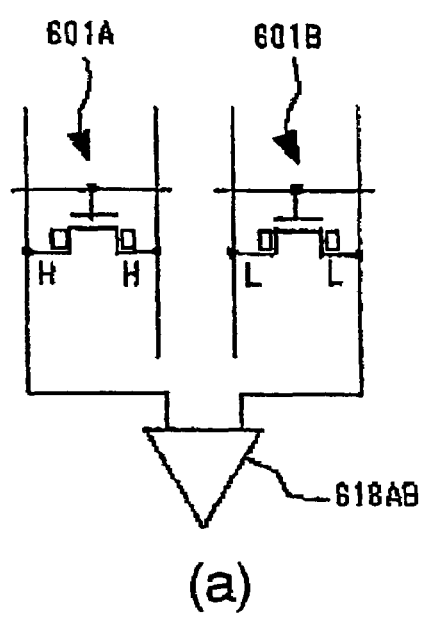
(a)
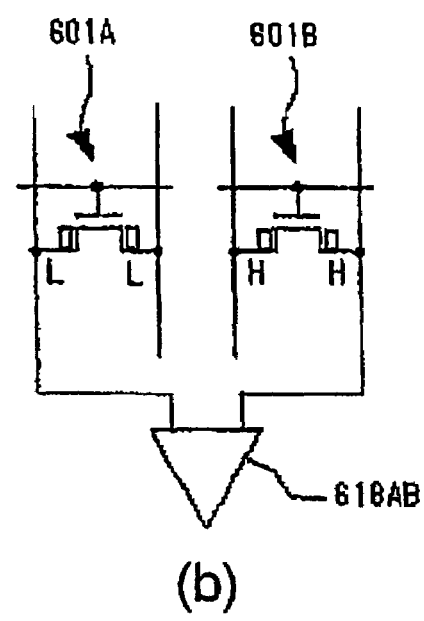
(b)

Conventional Art

SEMICONDUCTOR STORAGE DEVICE AND MOBILE ELECTRONIC APPARATUS

This non-provisional application claims priority under 35 U.S.C. §119(a) on Patent Application No. 2003-142509 filed in Japan on May 20, 2003, the entire contents of which are hereby incorporated by reference.

BACKGROUND OF THE INVENTION

1. Field of the Invention

The present invention relates to a semiconductor storage device and a mobile electronic apparatus.

2. Description of the Related Art

One representative type of conventional non-volatile memory is the flash memory.

In the flash memory, as shown in FIG. 30, a floating gate 902, an insulating film 907, and a word line (control gate) 903 are provided via a gate insulating film on a semiconductor substrate 901 in this order, and a source line 904 and a bit line 905, which are diffusion regions, are provided on opposite sides of the floating gate 902, constituting a memory cell. The memory cell is surrounded by an isolation region 906 (e.g., Japanese Laid-Open Publication No. 5-304277).

The memory cell holds data depending on the more or less of the amount of charge in the floating gate 902. A plurality of memory cells are arranged into a memory cell array. In the memory array, data is rewritten into or read from a desired memory cell by applying a prescribed voltage thereto via a particular word line and bit line selected.

Such a flash memory has drain current (Id) vs. gate voltage (Vg) characteristics as shown in FIG. 31 when the charge amount of the floating gate is changed. When the amount of negative charge in the floating gate is increased, the threshold is increased and the Id-Vg curve is substantially translated in a direction such that Vg is increased.

However, in this flash memory, the insulating film 907 is functionally required to separate the floating gate 902 from the word line 903. In addition, it is difficult to obtain a thin gate insulating film, because the thinner film is likely to cause charge leakage from the floating gate 902. Therefore, it is difficult to practically obtain a thin insulating film 907 and a thin gate insulating film, which is an obstacle to the miniaturization of memory cells.

SUMMARY OF THE INVENTION

According to an aspect of the present invention, a semiconductor storage device is provided, which comprises: a memory array comprising a plurality of memory elements; a write state machine for performing a sequence of a program operation or an erase operation with respect to the memory array; a decoder for decoding a signal indicating a current state of the write state machine, which is output from the write state machine, and outputting a status signal indicating a status of the program operation or the erase operation with respect to the memory array; a status register for storing the status signal; and an output circuit for outputting the status signal stored in the status register. Each of the plurality of memory elements comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges.

In one embodiment of this invention, at least a portion of the memory function section of the memory element overlaps a portion of the diffusion region.

In one embodiment of this invention, the memory function section of the memory element comprises a charge retaining film having a function of retaining charges, the charge retaining film having a surface substantially parallel to a surface of the gate electrode.

In one embodiment of this invention, the memory function section of the memory element comprises a charge retaining film having a function of retaining charges, the charge retaining film extending substantially parallel to a side of the gate electrode.

In one embodiment of this invention, a semiconductor layer of the memory element has a region in a vicinity of the diffusion region, the region having a concentration higher than that of a vicinity of a surface of the semiconductor layer under the gate electrode.

In one embodiment of this invention, the memory element comprises: a charge retaining film having a function of retaining charges, the charge retaining film having a surface substantially parallel to a surf ace of the gate insulating film; and an insulating film separating the charge retaining film from a channel region or a semiconductor layer, the thickness of the insulating film being smaller than that of the gate insulating film and being 0.8 nm or more.

In one embodiment of this invention, at least a portion of the memory function section of the memory a element overlaps a portion of the diffusion region, the memory function section of the memory element comprises a charge retaining film having a function of retaining charges, and the charge retaining film is an insulating film.

According to another aspect of the present invention, a mobile electronic apparatus is provided, which comprises the above-described semiconductor storage device.

According to the semiconductor storage device of the present invention, a status signal indicating the status of a program operation or an erase operation with respect to a memory array is stored in a status register. The status signal is output from the status register. Thereby, the user can be informed of the status of a program operation or an erase operation with respect to a memory array. As a result, when a program operation or an erase operation fails, the user can determine whether to perform the same operation.

The mobile electronic apparatus of the present invention comprises the semiconductor storage device of the present invention, and therefore, has at least the same effect as that of the semiconductor storage device of the present invention.

Thus, the invention described herein makes possible the advantages of providing a semiconductor storage device comprising a memory array comprising a memory element which can be easily miniaturized, the device being capable of informing the user of the status of a program operation or an erase operation with respect to the memory array; and a mobile electronic apparatus comprising the semiconductor storage device.

These and other advantages of the present invention will become apparent to those skilled in the art upon reading and understanding the following detailed description with reference to the accompanying figures.

BRIEF DESCRIPTION OF THE DRAWINGS

FIG. 2 is a schematic cross-sectional view showing a variation of a memory element of the semiconductor storage device according to Embodiment 1 of the present invention.

FIG. 21 is a conceptual diagram showing a two-bit operation performed by two memory elements of a semiconductor storage device according to Embodiment 10 of the present invention.

FIG. 22 is a conceptual diagram showing a one-bit operation performed by two memory elements of a semiconductor storage device according to Embodiment 10 of the present invention.

DESCRIPTION OF THE PREFERRED EMBODIMENTS

Figure 1:
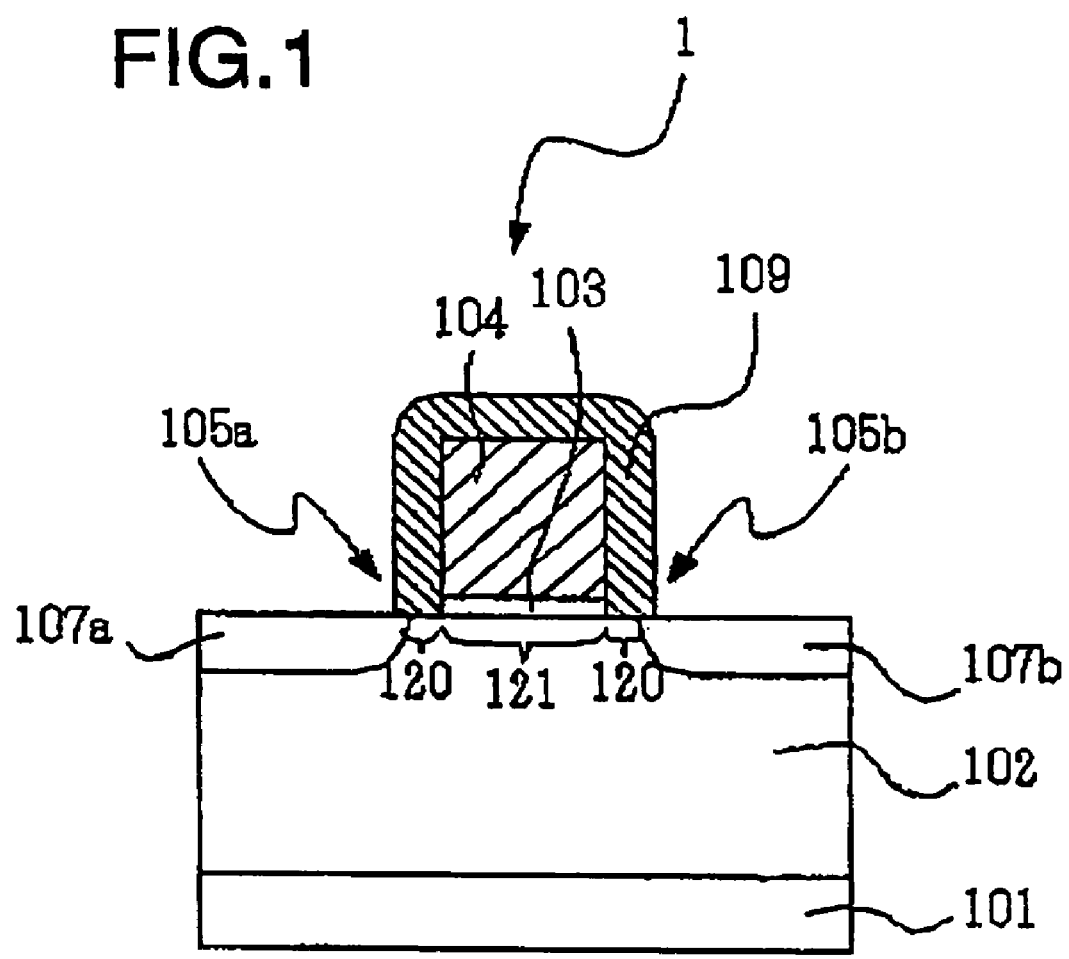
FIG. 1 is a schematic cross-sectional view showing a memory element of a semiconductor storage device according to Embodiment 1 of the present invention.

Hereinafter, the present invention will be described by way of illustrative examples with reference to the accompanying drawings.

The semiconductor storage device of the present invention comprises at least one memory element.

The memory element mainly comprises a semiconductor layer, a gate insulating film, a gate electrode, a channel region, a diffusion region, and a memory function section. As used herein, the term "channel region" refers to a region which typically has the same conductivity type as that of the semiconductor layer and is located directly under the gate electrode. As used herein, the term "diffusion region" refers to a region which has a conductivity type opposite to that of the channel region.

Specifically, the memory element of the present invention may comprise a first conductivity type region as a diffusion region, a second conductivity type region as a channel region, a memory function section extending across a border between the first and second conductivity type regions, and an electrode provided via a gate insulating film. Preferably, the memory element of the present invention may comprise a gate electrode provided on a gate insulating film, two memory function sections provided on opposite sides of the gate electrode, two diffusion regions each provided on a side of the memory function section opposite to the gate electrode, and a channel region provided under the gate electrode.

The semiconductor apparatus of the present invention is provided as semiconductor layers on a semiconductor substrate, and preferably, on a first conductivity type well region provided within the semiconductor substrate.

The semiconductor substrate is not particularly limited as long as it can be used in semiconductor apparatuses. Examples of the semiconductor substrate include bulk substrates made of, for example, an elemental semiconductor, such as silicon, germanium, or the like, or a compound semiconductor, such as silicon germanium, GaAs, InGaAs, ZnSe, GaN, or the like. Substrates having a semiconductor layer on a surface thereof may be used, including SOI (Silicon on insulator) substrates, SOS substrates, multilayer SOI substrates, glass or plastic substrates having a semiconductor layer, and the like. Particularly, a silicon substrate or an SOI substrate having a silicon layer on a surface thereof are preferable. The semiconductor substrate or the semiconductor layer may be monoscrystalline (e.g., using epitaxy), polycrystalline, or amorphous, depending on which the amount of current passing therewithin varies.

Preferably, an isolation region is provided on the semiconductor layer. In addition, an element, such as a translator, a capacitor, a resistor, or the like, may be provided on the semiconductor layer. These elements may be combined into a circuit or a semiconductor apparatus. The circuit or semiconductor apparatus may have a single layer structure, or a multilayer structure with interlayer insulating film(s). The isolation region may be made of an isolation film, such as a LOCOS film, a trench oxide film, an STI film, or the like. The semiconductor layer may have P-type or N-type conductivity. Preferably, at least one first conductivity type (P-type or N-type) well region is provided on the semiconductor layer. The impurity concentrations of the semiconductor layer and the well region may be within a range known in the art. Note that when an SOI substrate is used as the semiconductor layer, a well region may be provided in a surface semiconductor layer, while a body region may be provided under a channel region.

The gate insulating film is not particularly limited as long as it is commonly used for semiconductor apparatuses. For example, the gate insulating film may be a single-layer or multilayer film of an insulating film, such as a silicon oxide film, a silicon nitride film, or the like; and a highly dielectric film, such as an aluminum oxide film, a titanium oxide film, a tantalum oxide film, a hafnium oxide film, or the like. Particularly, a silicon oxide film is preferable. The gate insulating film preferably has a film thickness of about 1 to 20 nm, and more preferably about 1 to 6 nm. The gate insulating film may be provided only directly under a gate electrode, or may be larger (wider) than the gate electrode.

The gate electrode, which is provided on the gate insulating film, is in a shape which to typically used in semiconductor apparatuses or in a shape which has a recess portion at a lower end portion thereof. Note that the gate electrode is preferably in an integrated form without being divided by a single-layer or multilayer conductive film. However, the gate electrode may be divided by a single-layer or multilayer conductive film. The gate electrode may have a side wall insulating film on a side wall thereof. The gate electrode is not particularly limited as long as it is commonly used in semiconductor apparatuses. The gate electrode may be, for example, a single-layer or multilayer conductive film made of, for example, polysilicon, a metal (e.g., copper, aluminum, etc.), a high melting point metal (e.g., tungsten, titanium, tantalum, etc.), a silicide of a high melting point metal, or the like. The gate electrode preferably has a film thickness of, for example, about 50 to 400 nm. Note that the channel region is provided under the gate electrode.

Note that, preferably, the gate electrode is provided only on a side wall of the memory function section described below, or may not overlap an upper portion of the memory function section. With this arrangement, a contact plug can be positioned closer to the gate electrode, thereby facilitating the miniaturization of the memory element. In addition, the above-described simple arrangement facilitates the manufacture of the memory element, resulting in an improvement in yield.

The memory function section ham at least a function of retaining charge (hereinafter referred to as "charge retaining function"). In other words, the memory function section has a function of storing or retaining charge, trapping charge, or retaining a charge polarization state. This function is achieved by a particular film or region having a charge retaining function, which is contained in the memory function section. Such a film or region comprises silicon nitride, silicon, silicate glass containing an impurity (e.g., phosphor, boron, etc.), silicon carbide, alumina, a high dielectric (e.g., hafnium oxide, zirconium oxide, tantalum oxide, etc.), zinc oxide, a ferroelectric, a metal, or the like. Therefore, the memory function section may comprise a single-layer or multilayer structure of, for example, an insulating film comprising a silicon nitride film; an insulating film comprising a conductive film or a semiconductor layer therewithin; an insulating film comprising at least one conductor or semiconductor dot; an insulating film comprising a ferroelectric film in which inner charge is polarized due to an electric field and the polarization is maintained; or the like. Particularly, silicon nitride film is preferable. This is because silicon nitride film has the following benefits: 1) silicon nitride film has a high trap level of charges, and therefore, can have large hysteresis characteristics; 2) silicon nitride film also has a long charge retaining time, so that there is substantially no charge leakage due to generation of a leak path, and therefore, the charge retaining function is satisfactory; and 3) silicon nitride film is a standard material for the manufacture of LSIs.

When an insulating film comprising therewithin a film having a charge retaining function, such as a silicon nitride film or the like, is used as a memory function section, the reliability of retaining memories can be enhanced. Since silicon nitride film is an insulating material, even if charge leakage occurs in a portion of the film, all charges cannot be immediately eliminated throughout the silicon nitride film. When a plurality of memory elements are arranged, a distance between memory elements may be small, and thereby, some adjacent memory function sections may contact each other. In this case, if the memory function sections are made of a conductor, information stored in the memory function sections can be lost. However, the insulating film memory function section can avoid such a problem. In addition, a contact plug can be positioned closer to the memory function section. In some cases, the contact plug can overlap the memory function section. Therefore, the miniaturization of the memory element can be facilitated.

In order to enhance the reliability of retaining memories, a film-like shape to not necessarily required for a film having a charge retaining function. It is preferable that a film having a charge retaining function is discretely provided in an insulating film. Specifically, a film having a charge retaining function is preferably distributed in the form of dots in a material which resists retaining a charge, such as silicon oxide or the like.

When a conductive film or a semiconductor layer is used as a charge retaining film, the charge retaining film so preferably provided via an insulating film so that the charge retaining film does not directly contact a semiconductor layer (a semiconductor substrate, a well region, a body region, a source/drain region, or a diffusion region) or a gate electrode. For example, conductive films and insulating films are alternately stacked (multilayer structure); a conductive film is distributed in the form of dots in an insulating film; a conductive film is provided in a portion of a side wall insulating film provided on a side wall of a gate; and the like.

Preferably, by employing as a memory function section an insulating film comprising a conductive film or a semiconductor layer therewithin, the amount of charges to be injected into the conductor or semiconductor film can be controlled substantially freely, thereby obtaining a multivalued memory function section.

Preferably, by employing as a memory function section an insulating film comprising at least one conductor or semiconductor dot, write/erase operation due to direct tunneling of charge can be facilitated, resulting in lower power consumption.

A ferroelectric film, such as PZT, PLZT, or the like, in which a polarization direction varies depending on electric field, maybe used as a memory function section. In this case, charges are substantially generated on a surface of a ferroelectric film due to polarization, and such a state is maintained. Therefore, the ferroelectric film memory function section, can have hysteresis characteristics similar to that of a film having a memory function, such that charges are supplied from the outside of the film and are then trapped by the film. In addition, the ferroelectric film can retain charges without injection of charges from the outside of the film. In the ferroelectric film, hysteresis characteristics can be obtained only due to the polarization of charges within the film. Therefore, the ferroelectric film can preferably provide high-speed write/erase operation.

Note that the insulating film contained in the memory function section is preferably a film which has a region or function of obstructing escaping charges. An exemplary film having a function of obstructing escaping charges is a silicon oxide film or the like.

The charge retaining film contained in the memory function section is provided on opposite sides of the gate electrode directly or via an insulating film, or is provided on a semiconductor layer (a semiconductor substrate, a well region, a body region, or a source/drain region or a diffusion region) directly or via a gate insulating film. The charge retaining film on the opposite sides of the gate electrode preferably overlap the entire or a part of the side wall of the gate electrode directly or via an insulating film. In an exemplary application in which the gate electrode has a recess portion in a lower end portion thereof, the charge retaining film may be formed directly or via an insulating film to bury the recess portion completely or partially.

The diffusion region can function as a source/drain region, and has a conductivity type opposite to that of the semiconductor layer or the well region. The junction between the diffusion region and the semiconductor layer or the well region preferably has a steep gradient of impurity concentration. This is because hot electrons or hot holes are efficiently generated at a lower voltage, i.e., a high-speed operation can be achieved at a low voltage. The junction depth of the diffusion region is not particularly limited, and can be adjusted as appropriate, depending on the desired function of a semiconductor storage device or the like. Note that when an SOI substrate is used as a semiconductor substrate, the diffusion region may have a junction depth smaller than a film thickness of the surface semiconductor layer. Preferably, the junction depth is approximately equal to the film thickness of the surface semiconductor layer.

The diffusion region may be disposed to overlap an end of the gate electrode, to be contiguous to an end of the gate electrode, or to be offset from an end of the gate electrode. Particularly when the diffusion region is offset from an end of the gate electrode, the inversion of an offset region under the charge retaining film, which is caused by applying a voltage to the gate electrode, depends largely on the amount of charges accumulated in the memory function section. Therefore, preferably, the memory effect is increased and the short channel effect is reduced. However, when the off set is large, a driving current between the diffusion regions (source/drain) is significantly reduced. Therefore, the offset, i.e., a distance from one end of the gate electrode to the nearer diffusion region in the longitudinal direction of the gate electrode, is preferably shorter than a thickness of the charge retaining film in a direction parallel to the gate longitudinal direction. It is particularly important that at least a portion of a film or region in the memory function section, which has a charge retaining function, overlaps a portion of the diffusion region. The essence of the memory element contained in the semiconductor storage device of the present invention is that a memory is rewritten by an electric field across the memory function section generated by a voltage difference between the gate electrode present only on the side wall portion of the memory function section, and the diffusion region.

A portion of the diffusion region may be provided above a surface of the channel region, i.e., a lower surface of the gate insulating film. In this case, it is appropriate that a conductive film is formed on the diffusion region provided in the semiconductor substrate in a manner that integrates the conductive film with the diffusion region. Examples of such a conductive film is include a semiconductor (e.g., polysilicon, amorphous silicon, etc.), silicide, the above-described metals, high melting point metals, and the like. Particularly, polysilicon is preferable. Since polysilicon has a very high impurity diffusion rate as compared with that of the semiconductor layer, it is easy to obtain a shallow junction depth of the diffusion region in the semiconductor layer, i.e., it is easy to suppress the short channel affect. Note that, in this case, at least a portion of the memory function section as well as the gate electrode are preferably located between the diffusion regions.

The memory element of the present invention can be formed in a manner similar to a technique, in which a typical semiconductor process is used to form a side-wall spacer having a single-layer or multilayer structure on, for example, a aide wall of the gate electrode. Specifically, after the gate electrode is formed, a single-layer film or multilayer film comprising a film having a charge retaining function (hereinafter referred to as "charge retaining film"), a charge retaining film/an insulating film, an insulating film/a charge retaining film, an insulating film/a charge retaining film/an insulating film, or the like, are formed. The resultant film is subjected to etch back under appropriate conditions so as to leave a residual film in the form of a side-wall spacer. Alternatively, an insulating film or a charge retaining film is farmed. Etch back is performed under appropriate conditions so that a residual film to left in the form of a side-wall spacer. Another charge retaining film or an insulating film is formed. Etch back is similarly performed so that a residual film is left in the form of a side-wall spacer. Alternatively, an insulating film material, in which particulate charge retaining materials are distributed, is applied or deposited on a semiconductor layer comprising a gate electrode. Etch back to performed under appropriate conditions so that a residual insulating film material is left in the form of a side-wall spacer. Alternatively, after a gate electrode is formed, the above-described single-layer film or multilayer film to formed. Patterning is performed using a mask. Alternatively, a charge retaining film, a charge retaining film/an insulating film, an insulating film/a charge retaining film, an insulating film/a charge retaining film/an insulating film, or the like is formed before forming a gate electrode. An opening is formed in a region which will be a channel region in these films. A gate electrode material film is formed on the entire surface of the resultant structure. The gate electrode material film is subjected to patterning in such a manner that a portion thereof, which buries the opening and has a size broader than that of the opening, is left. The present invention is not limited to these methods.

When a plurality of memory elements of the present invention are arranged into an array (memory cell array), the best mode of the memory element to obtained if all of the following requirements are satisfied: for example, (1) the gate electrodes of a plurality of memory elements are integrated together to function as a word line; (2) a memory function section is provided on opposite sides of the word line; (3) an insulator, particularly a silicon nitride film, retains charges in the memory function section; (4) the memory function section is made of ONO (Oxide Nitride Oxide) film, and the silicon nitride film has a surface substantially parallel to a surface of the gate insulating film; (5) the silicon nitride film in the memory function section is separated from the word line and the channel region by the silicon oxide film; (6) the insulating film (silicon nitride film) in the memory function section and the diffusion region overlap each other; (7) a thickness of the insulating film separating the silicon nitride film having a surface substantially parallel to a surface of the gate insulating film from the channel region or the semiconductor layer, is different from a thickness of the gate insulating film; (8) writing and erasure of a single memory element are performed via a single word line; (9) no electrode (word line) having a function of aiding writing and erasure is possessed on the memory function section; and (10) a region having high impurity concentration and a conductivity type opposite to that of the diffusion region is provided directly under the memory function section and adjacent to the diffusion region. Note that a memory element which satisfies at least one of the requirements may be used herein.

A particularly preferable combination of the above-described requirements include that (3) an insulator, particularly a silicon nitride film, retains charges in the memory function section; (6) the insulating film (silicon nitride film) in the memory function section and the diffusion region overlap each other; and (9) no electrode (word line) having a function of aiding write and erase operations is possessed on the memory function section.

A memory element, which satisfies the requirements (3) and (9), is considerably useful as described below. A bit line contact can be disposed closer to a memory function section on a sidewall of a word line. In addition, even when memory elements are close to each other, a plurality of memory function sections do not interfere with each other, thereby retaining memory information. Therefore, the miniaturization of memory elements is facilitated. Note that when the charge retaining region in the memory function section is made of a conductor, charge retaining regions interfere with each other due to capacity coupling as memory elements are disposed closer to each other, whereby memory information cannot be retained.

When the charge retaining region in the memory function section is made of an insulator (e.g., a silicon nitride film, etc.), it is not necessary that a separate memory function section is provided in each memory cell. For example, memory function sections, which are provided on opposite sides of a word line shared by a plurality of memory cells, need not be separated from each other in each memory cell. The memory function sections provided on the opposite sides of the word line can be shared by the plurality of memory cells sharing the word line. Therefore, a photolithography step and an etching step for separation of memory function sections are not required, thereby simplifying manufacturing processes. In addition, a positioning margin in a photolithography step and a margin for film reduction by etching are not required, thereby making it possible to reduce a margin between memory cells. Therefore, as compared with when the charge retaining region in the memory function section is made of a conductor (e.g., polycrystalline silicon film), the footprint of a memory cell can be reduced even if the same level of micromachining is used. Note that when the charge retaining region in the memory function section is made of a conductor, a photolithography step and an etching step for separating memory function sections for each memory cell are required. In this came, a photolithography positioning margin and an etching film reduction margin are required.

In addition, no electrode having a function of aiding write and erase operations is provided an the memory function section, and therefore, the device structure is simple, whereby the number of steps can be reduced and the yield can be improved. Therefore, it is possible to integrate the memory element of the present invention with transistors constituting a logic circuit or an analog circuit. Moreover, inexpensive semiconductor storage devices can be obtained.

It is more preferable that the requirement (6) as well as the requirements (3) and (9) are satisfied. Specifically, when a charge retaining region in a memory function section and a diffusion region overlap each other, write and erase operations can be performed at a considerably lower voltage. Specifically, for example, write and erase operations can be performed at such low a voltage as 5 V or less. This to a considerably large effect in terms of circuit design. A high voltage, which is required for flash memories, is not required in a chip. Therefore, a charge pumping circuit, which requires a large footprint, can be omitted or its size can be reduced. Particularly, when a small-capacity memory is incorporated for adjustment into a logic LSI, the footprint of peripheral circuitry for driving the memory cell is dominant in the memory portion as compared with the footprint of the memory cell. Therefore, by omitting a voltage boosting circuit for a memory cell or reducing the size thereof, the size of a chip can be most effectively reduced.

When the requirement (3) is not satisfied, i.e., a conductor is used to retain charges in the memory function section, a write operation can be performed even if the requirement (6) is not satisfied, i.e., the conductor in the memory function section and a diffusion region do not overlap each other. This is because the conductor in the memory function section aids writing due to capacity coupling with the gate electrode.

When the requirement (9) is not satisfied, i.e., an electrode having a function of aiding write and erase operations is provided on the memory function section, writing can be performed even if the requirement (6) to not satisfied, i.e., an insulator in the memory function section and a diffusion region do not overlap each other.

In the semiconductor storage device of the present invention, one or both ends of the memory element may be connected to a transistor in series, or alternatively, the memory element and a logic transistor may be integrated together on the same chip. In this case, the semiconductor device of the present invention, particularly the memory element, can be formed by a process having high affinity to a standard process for typical transistors (e.g., transistors, logic transistors, etc.). Therefore, the memory element and transistors can be simultaneously formed. Therefore, a process for integrating the memory element with a transistor or a logic transistor is simple, thereby making it possible to obtain an inexpensive integrated device.

In the semiconductor storage device of the present invention, one memory function section can store two or more-level information, whereby the memory element can store 4 or more-level information. Note that the memory element may store only two-level information. In addition, when the variable resistor effect of the memory function section is utilized, the memory element can function as a memory cell having functions of both a selection transistor and a memory transistor.

The semiconductor storage device of the present invention may be combined with a logic element, a logic circuit, or the like to provide a wide variety of applications of electronic apparatuses, such as data processing systems (e.g., personal computers, notebook computers, laptop computers, personal assistant/signal emitters, minicomputers, workstations, mainframes, multiprocessor computers or all other types of computer systems); electronic parts contained in data processing systems (e.g., CPUs, memories, data storage devices, etc.); communication apparatuses (e.g., telephones, PHS, modems, rooters, etc.); image display apparatuses (e.g., display panels, projectors, etc.); business machines (e.g., printers, scanners, copying machines, etc.); video apparatuses (e.g., video cameras, digital cameras, etc.); entertainment apparatuses (e.g., game machines, music players, etc.) information apparatuses (e.g., personal digital assistants, clocks and watches, electronic dictionaries, etc.); apparatuses carried on cars (e.g., car navigation systems, car audio apparatuses, etc.); audio/video apparatuses for recording/reproducing information, such as moving images, static images, music, and the like; electrical appliances (e.g., washing machines, microwave ovens, refrigerators, rise cookers, dishwashers, vacuum cleaners, air conditioners, etc.); health care apparatuses (e.g., massaging machines, scales, sphygmomanometers, etc.); mobile storage devices (e.g., IC cards, memory cards, etc.); or the like. Particularly, the semiconductor storage device of the present invention is useful for mobile electronic apparatuses, such as mobile telephones, mobile information terminals, IC cards, memory cards, mobile computers, mobile game machines, digital cameras, portable video players, portable music players, electronic dictionaries, clocks and watches, and the like. Note that the semiconductor storage device of the present invention may be incorporated as at least a portion of a control circuit or a data storage circuit of an electronic apparatus, or may be optionally incorporated in a detachable manner.

A method for producing the above-described memory element will be described below with reference to FIG. 8. A gate insulating film 214 and a gate electrode 217 are formed on a semiconductor substrate 211 using known procedures. Thereafter, a silicon oxide film 241 having a film thickness of 0.8 to 20 nm, more preferably 3 to 10 nm, is formed using a thermal oxidation method or is deposited using a CVD (Chemical Vapor Deposition) method on an entire surface of the semiconductor substrate 211. Next, a silicon nitride film 242 having a film thickness of 2 to 15 nm, more preferably 3 to 10 nm, is deposited on an entire surface of the silicon oxide film 241 using the CVD method. Further, a silicon oxide film 243 having a thickness of 20 to 70 nm is deposited on an entire surface of the resultant structure using the CVD method.

Thereafter, the silicon oxide film/silicon nitride film/silicon oxide film is etched back by anisotropic etching. As a result, memory function sections 261 and 262, which are optimal to storage, are formed in the form of a side-wall spacer on side walls of the gate electrode 217.

Thereafter, the gate electrode 217 and the side-wall spacer memory function sections 261 and 262 are used as a mask to perform ion implantation to form diffusion layer regions (source/drain region) 212 and 213. Thereafter, silicide steps or upper wiring steps may be performed using known procedures.

Hereinafter, embodiments of a semiconductor storage device, a mobile electronic apparatus, a method for controlling erasure and programming of data stored therein will be described with reference to accompanying drawings.

(Embodiment 1)

A semiconductor storage device according to Embodiment 1 of the present invention comprises a memory element 1 as shown in FIG. 1.

The memory element 1 comprises a semiconductor substrate 101, a P-type well region 102, a gate insulating film 103, and a gate electrode 104. The P-type well region 102 is provided on the semiconductor substrate 101. The gate electrode 104 is provided via the gate insulating film 103 on the P-type well region 102. A silicon nitride film 109 having a trap level for retaining charges (charge retaining film) is provided on an upper surface and side surfaces of the gate electrode 104. Portions of the silicon nitride film 109 on side wall portions of the gate electrode 104 are memory function portions 105a and 105b, respectively, which actually retain charges. The term "memory function portion" refers to a memory function section or a portion of the charge retaining film in which charges are actually accumulated due to a rewrite operation. N-type diffusion regions 107a and 107b, which function as a source region or a drain region, respectively, are provided on opposite sides of the gate electrode 104 and within the P-type well region 102. The diffusion regions 107a and 107b have an offset structure. Specifically, the diffusion regions 107a and 107b do not reach a region 121 under the gate electrode 104. An offset region 120 under the charge retaining film constitutes a portion of a channel region.

Note that the memory function portions 105a and 105b, which substantially retain charges, are side wall portions of the gate electrode 104. Therefore, the silicon nitride film 109 may be provided only on a region corresponding to the above-described portions ((a) of FIG. 2). The memory function portions 105a and 105b may have a structure such that conductor or semiconductor microparticles 111 having a nanometer order size are dispersed in an insulating film 112 ((b) of FIG. 2). In this case, if the size of each microparticle 111 is less than 1 nm, the quantum effect is too great for charges to tunnel to the dot. If the size of each microparticle 111 is more than 10 nm, no significant quantum effect occurs at room temperature. Therefore, a diameter of the microparticle 111 is preferably in the range of 1 nm to 10 nm. Further, the silicon nitride film 109 (charge retaining film) may be provided on the side of the gate electrode 104 in the form of a side-wall spacer ((a) of FIG. 2).

The principle of writing information into the memory element will be described with reference to FIGS. 3 and 4. It is now assumed that entire memory function sections 131a and 131b function to retain charges. The term "writing" refers to implantation of electrons into the memory function sections 131a and 131b when the memory element is of an N channel type. Hereinafter, the memory element is assumed to be of the N channel type.

Figure 3:
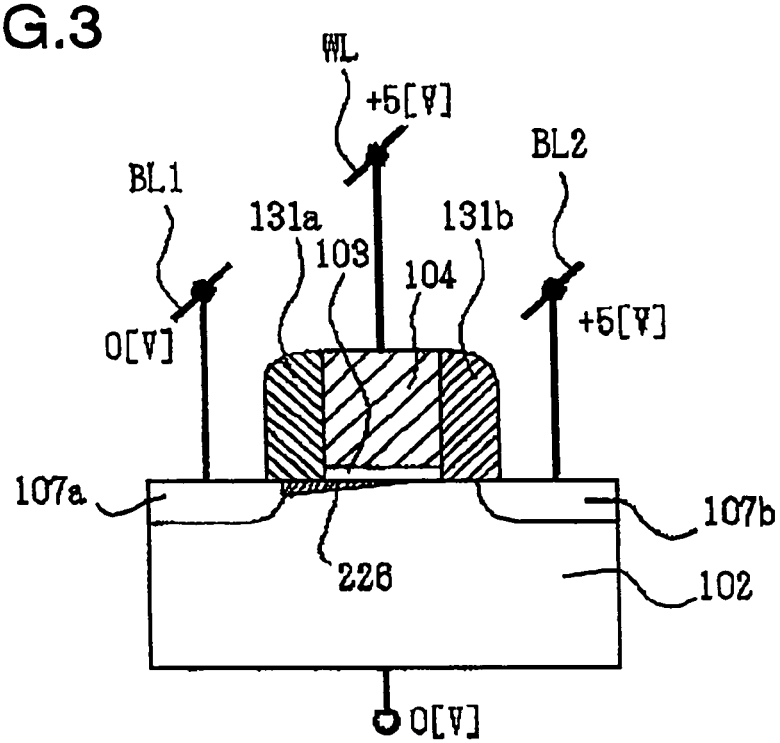
FIG. 3 is a schematic diagram for explaining a write operation of a memory element of the semiconductor storage device according to Embodiment 1 of the present invention.

To implant electrons into the second memory function section 131b (writing), as shown in FIG. 3, the N-type first diffusion region 107a is caused to function as a source electrode, while the N-type second diffusion region 107b is caused to function as a drain electrode. For example, a voltage of 0 V to applied to the first diffusion region 107a, a voltage of 0 V to applied to the P-type well region 102, a voltage of +5 V is applied to the second diffusion region 107b, and a voltage of +5 V is applied to the gate electrode 104. Under these voltage conditions, an inversion layer 226 extends from the first diffusion region 107a (source electrode), but does not reach the second diffusion region 107b (drain electrode), so that a pinch-off point occurs. Electrons are accelerated from the pinch-off point to the second diffusion region 107b (drain electrode), due to a high electronic field, to become hot electrons (highly energized conductive electrons). The hot electrons are implanted into the second memory function section 131b, resulting in writing. Note that in the vicinity of the first memory function section 131a, no hot electrons occur, i.e., writing is not performed.

Figure 4:
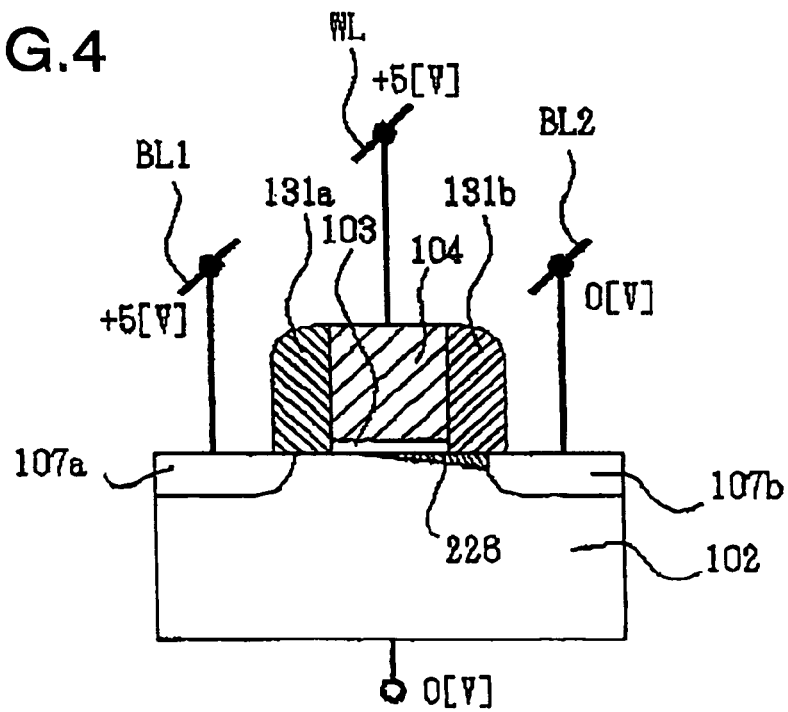
FIG. 4 is a schematic diagram for explaining a write operation of a memory element of the semiconductor storage device according to Embodiment 1 of the present invention.

To implant electrons into the first memory function section 131a (writing), as shown in FIG. 4, the second diffusion region 107b is caused to function as a source electrode, the first diffusion region 107a is caused to function as a drain electrode. For example, a voltage of 0 V is applied to the second diffusion region 107b and the P-type well region 102, a voltage of +5 V is applied to the first diffusion region 107a, and a voltage of +5 V is applied to the gate electrode 104. Thus, by implanting electrons into the first memory function section 131a instead of the second memory function section 131b (exchange of a source/drain region), writing can be performed.

Next, the principle of erasure of the memory element will be described with reference to FIGS. 5 and 6.

Figure 5:
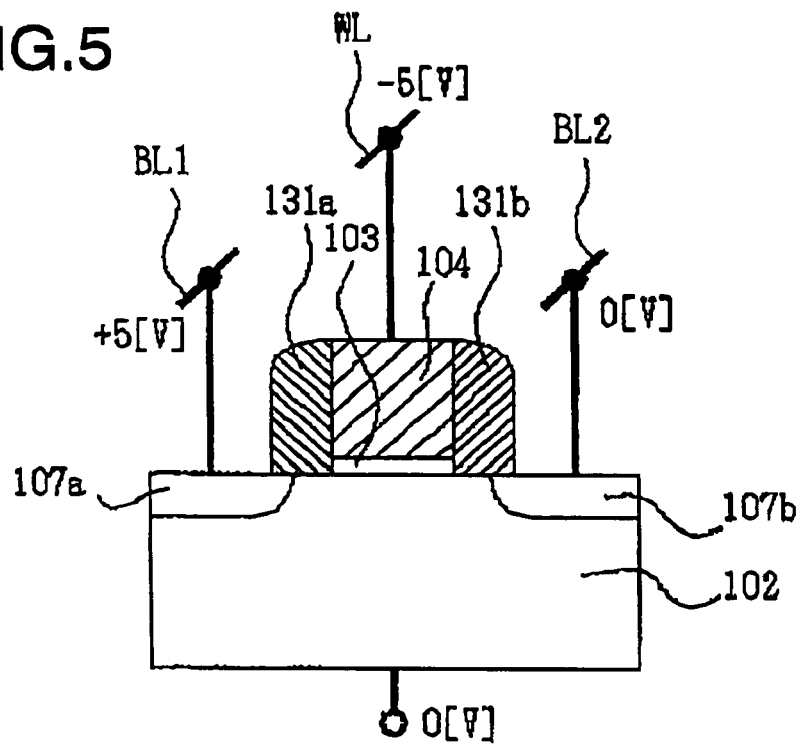
FIG. 5 is a schematic diagram for explaining an erase operation of a memory element of the semiconductor storage device according to Embodiment 1 of the present invention.

In a first method for erasing information stored in the first memory function section 131a, as shown in FIG. 5, a positive voltage (e.g., +5 V) to applied to the first diffusion region 107a, while a voltage of 0 V is applied to the P-type well region 102, so that a backward bias is applied to the PN junction between the first diffusion region 107a and the P-type well region 102. In addition, a negative voltage (e.g., −5 V) to applied to the gate electrode 104. In this case, the potential gradient of the PN junction is particularly steep in the vicinity of the gate electrode 104 due to a negative voltage applied to the gate electrode. Therefore, due to a tunnel between bands, hot holes (highly energized holes) are generated in a portion of the PN junction closer to the P-type well region 102. The hot holes are attracted toward the gate electrode 104 having a negative potential. As a result, the holes are implanted into the first memory function section 131a. Thus, information stored in the first memory function section 131a is erased. In this case, a voltage of 0 V is applied to the second diffusion region 107b.

To erase information stored in the second memory function section 131b, the potential is exchanged between the first diffusion region and the second diffusion region.

Figure 6:
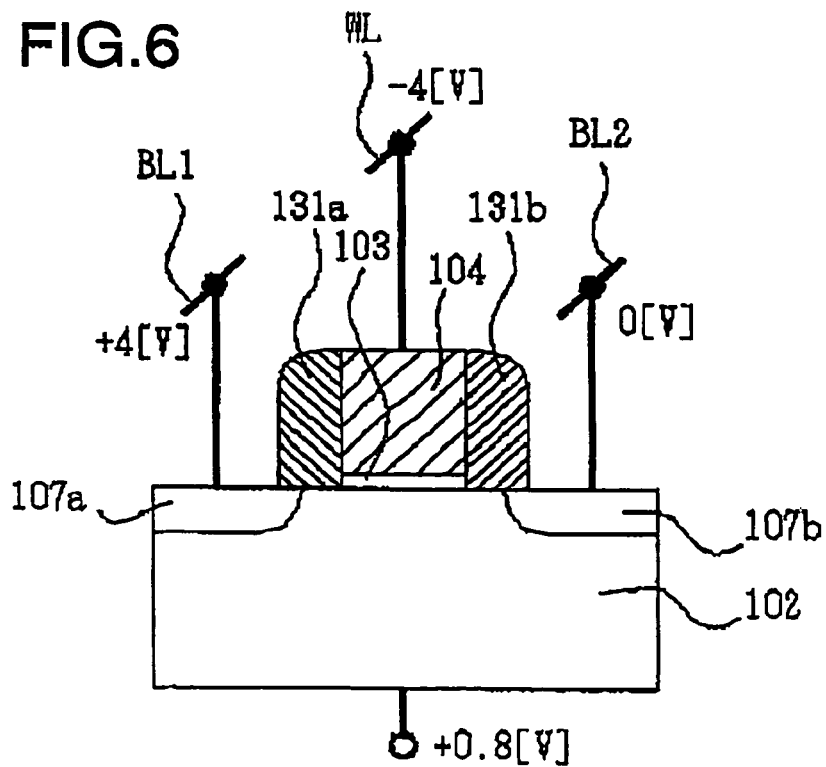
FIG. 6 is a schematic diagram for explaining an erase operation of a memory element of the semiconductor storage device according to Embodiment 1 of the present invention.

In a second method for erasing information stored in the first memory function section 131a, as shown in FIG. 6, a positive voltage (e.g., +4 V) is applied to the first diffusion region 107a, a voltage of 0 V is applied to the second diffusion region 107b, a negative voltage (e.g., −4 V) is applied to the gate electrode 104, and a positive voltage (e.g., +0.8 V) is applied to the P-type well region 102. In this case, a forward voltage is applied between the P-type well region 102 and the second diffusion region 107b, so that electrons are implanted into the P-type well region 102. The implanted electrons are diffused up to the PN junction between the P-type well region 102 and the first diffusion region 107a, in which the electrons are then accelerated by strong electronic field to become hot electrons. The hot electrons generate electron-hole pairs in the PN junction. That is, by applying a forward voltage between the P-type well region 102 and the second diffusion region 107b, the electrons implanted in the P-type well region 102 trigger generation of hot holes in the other PN junction. The hot holes generated in the PN junction are attracted toward the gate electrode 104 having a negative potential. As a result, the holes are implanted into the first memory function section 131a.

In the second method, even when a voltage applied to the PN junction between the P-type well region and the first diffusion region 107a is insufficient for creating a tunnel between bands so that hot holes are not generated in the PN junction, the electrons implanted from the second diffusion region 107b trigger generation of electron-hole pairs in the PN junction, so that hot holes can be generated. Therefore, a voltage required for erasure can be lowered. Particularly, when the offset region 120 (FIG. 1) is provided, the PN junction, which is caused by the negative potential applied to the gate electrode, is not very steep. Therefore, in the case, the generation of hot holes due to a tunnel between bands is hindered. Despite this, the second method compensates for such a drawback and can perform erasure at a low voltage.

Note that in the first erasure method, information stored in the first memory function section 131a is erased by applying a voltage of +5 V to the first diffusion region 107a. In the second erasure method, only +4 V is sufficient. Thus, the second method can reduce a voltage for erasure, i.e., can reduce power consumption, thereby making it possible to suppress deterioration of the memory element due to hot carriers.

In either the first or second method, the memory element resists over-erasure. The term "over-erasure" refers to a phenomenon that as the amount of holes accumulated in the memory function section is increased, the threshold is decreased without saturation. Over-erasure raises a significant problem in EEPROM, such as representatively flash memory and the like. Particularly, when the threshold is negative, it becomes impossible to select memory cells, which is a critical operation error. On the other hand, in the memory element of the semiconductor storage device of the present invention, even when a large amount of holes are accumulated in the memory function section, electrons are induced only under the memory function section, leaving the potential of the channel region under the gate insulating film substantially unaffected. Since the erasure threshold is determined by the potential under the gate insulating film, over-erasure is unlikely to occur.

Figure 7:
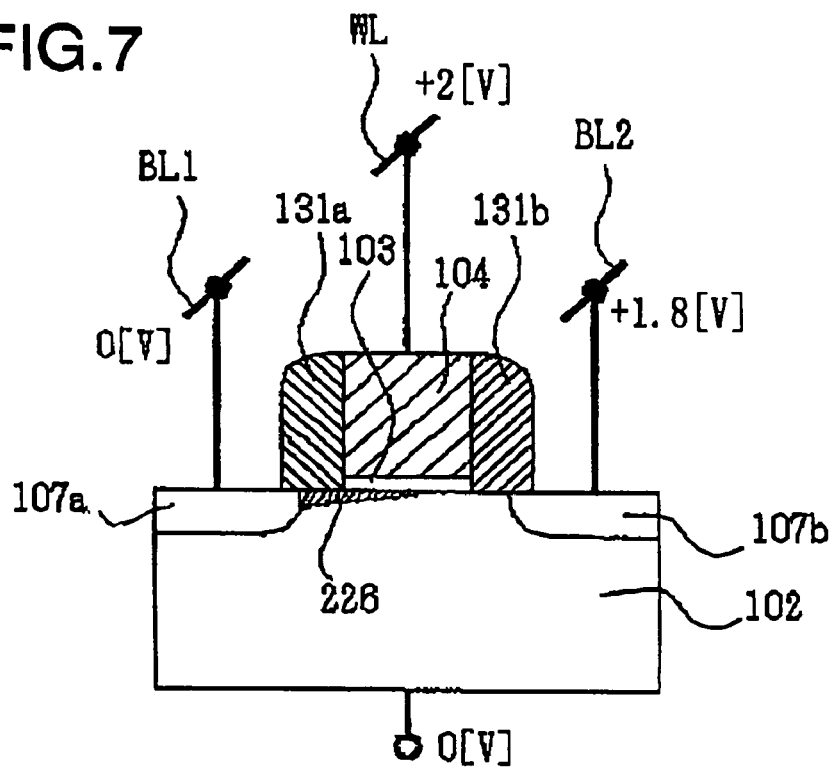
FIG. 7 is a schematic diagram for explaining a is read operation of a memory element of the semiconductor storage device according to Embodiment 1 of the present invention.

A principle of a read operation of the memory element will be described with reference to FIG. 7.

To read information stored in the first memory function section 131a, the first diffusion region 107a is caused to function as a source electrode of the transistor, while the second diffusion region 107b is caused to function as a drain electrode of the transistor. For example, a voltage of 0 V is applied to the first diffusion region 107a and the P-type well region 102, a voltage of +1.8 V is applied to the second diffusion region 107b, and a voltage of +2 V is applied to the gate electrode 104. In this case, when electrons are not accumulated in the first memory function section 131a, a drain current is likely to flow. On the other hand, when electrons are accumulated in the first memory function section 131a, an inversion layer to unlikely to be formed in the vicinity of the first memory function section 131a, so that a drain current is unlikely to flow. Therefore, by detecting the drain current, it is possible to read information stored in the first memory function section 131a. Particularly when a voltage which causes a pinch-off operation is applied for a read operation, the state of charge accumulation in the first memory function section 131a can be precisely determined irrespective of the presence or absence of charge accumulation in the second memory function section 131b.

To read information stored in the second memory function section 131b, the second diffusion region 107b is caused to function as a source electrode of the transistor, while the first diffusion region 107a is caused to function as a drain electrode of the transistor. For example, a voltage of 0 V is applied to the second diffusion region 107b and the P-type well region 102, a voltage of +1.8 V is applied to the first diffusion region 107a, and a voltage of +2 V is applied to the gate electrode 104. Thus, as compared to when information stored in the first memory function section 131a is read out, by exchanging source/drain regions, information stored in the second memory function section 131b can be read out.

Note that when a portion of the channel region remains not covered with the gate electrode 104 (such a portion is the offset region 120), an inversion layer is extinguished or formed in the portion of the channel region not covered with the gate electrode 104, depending on the presence or absence of excessive charges in the memory function sections 131a and 131b. As a result, a large hysteresis (threshold change) is obtained. Note that when the width of the offset region 120 is considerably large, a drain current is significantly reduced, leading to a significant reduction in the read rate. Therefore, the width of the offset region 120 to preferably determined so as to achieve a sufficient hysteresis and read rate.

Even when the diffusion regions 107a and 107b each reach the end of the gate electrode 104, i.e., the diffusion regions 107a and 107b each overlap the gate electrode 104, the threshold of the transistor is not substantially changed by a write operation. However, a parasitic resistance at a source/drain end is significantly changed, so that a drain current is significantly reduced (by one order of magnitude or more). Therefore, it is possible to perform a read operation by detecting the drain current, thereby obtaining a function as a memory. Note that when a greater memory hysteresis effect is required, it is more preferable that the diffusion regions 107a and 107b do not overlap the gate electrode 104 (i.e., the offset region 120 exists).

With the above-described operation method, it is possible to write and erase two bits of data per transistor. In addition, memory elements may be arranged into a memory array, where a word line WL is connected to the gate electrode 104, a first bit line BL1 is connected to the first diffusion region 107a, and a second bit line BL2 is connected to the second diffusion region 107b.

In the above-described operation method, by exchanging between the source electrode and the drain electrode, writing and erasure of two bits of data per transistor is achieved. Alternatively, the source electrode and the drain electrode may be fixed so that the transistor functions as a one-bit memory. In this case, one of the source and drain regions can be caused to have a common fixed voltage, so that the number of bit lines connected to the source/drain region can be reduced by half.

As is clearly understood from the above description, in the memory element of the semiconductor storage device of the present invention, the memory function section is provided separately from the gate insulating film and is positioned on the opposite aides of the gate electrode, so that a two-bit operation can be achieved. The memory function sections are separated from each other by the gate electrode. Therefore, the interference between the memory function sections can be effectively suppressed when rewriting is performed. In addition, since the gate insulating film is separated from the memory function section, the gate insulating film can be a thin film, thereby making it possible to suppress a short channel effect. Therefore, it is easy to miniaturize a memory element, and further, a semiconductor storage device.

(Embodiment 2)

Figure 8:
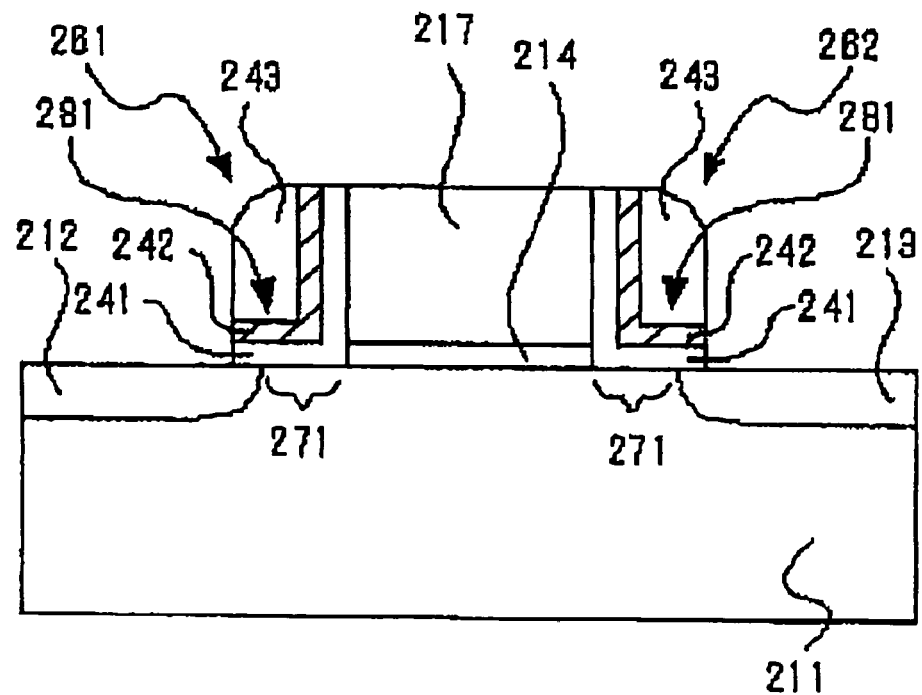
FIG. 8 is a schematic cross-sectional view showing a memory element of a semiconductor storage device according to Embodiment 2 of the present invention.

A memory element of a semiconductor storage device according to Embodiment 2 of the present invention has substantially the same structure as that of the memory element 1 of FIG. 1, except that memory function sections 261 and 262 each comprise a region for retaining charges (region for accumulating charges (e.g., a film having a function of retaining charges) and a region for obstructing escaping charges (e.g., a film having a function of obstructing escaping charges) as shown in FIG. 8.

The memory function sections 261 and 262 preferably each comprise a charge retaining film having a function of retaining charges and an insulating film for the purpose of improving the ability to retain memories. In Embodiment 2, a silicon nitride film 242 having a trap level of charges is used as a charge retaining film, while silicon oxide films 241 and 243 having a function of preventing dissipation of charges accumulated in the charge retaining film are used as insulating films. Since the memory function section comprises a charge retaining film and an insulating film, the dissipation of charges can be prevented, thereby improving the retaining ability. In addition, as compared with when a memory function section consists only of a charge retaining film, the volume of a charge retaining film can be reduced as appropriate. Thereby, the movement of charges within the charge retaining film is limited, so that the occurrence of changes in characteristics due to the movement of charges can be suppressed during the retaining of a memory. In addition, a silicon nitride film 242 is interposed between silicon oxide films 241 and 243, whereby the efficiency of charge implantation is increased during a rewrite operation so that a higher-speed operation can be obtained. Note that in this memory element, the silicon nitride film 242 may be replaced with one that is made of a ferroelectric material.

Regions (the silicon nitride film 242) of the memory function sections 261 and 262, which retain charges, overlap diffusion regions 212 and 213, respectively. In this case, the term "overlap" means that at least a portion of the region (silicon nitride film 242) for retaining charges is provided on at least a portion of the diffusion region 212 and 213. Note that reference numeral 211 indicates a semiconductor substrate, reference numeral 214 indicates a gate insulating film, reference numeral 217 indicates a gate electrode, a reference numeral 271 indicates an off set region between the gate electrode 217 and diffusion regions 212 and 213. Though not shown, a channel region is provided under the gate insulating film 214, i.e., on an uppermost surface of the semiconductor substrate 211.

An effect of overlapping of the silicon nitride film 242, which is a region for retaining charges in the memory function sections 261 and 262, and the diffusion regions 212 and 213, will be described below.

Figure 9:
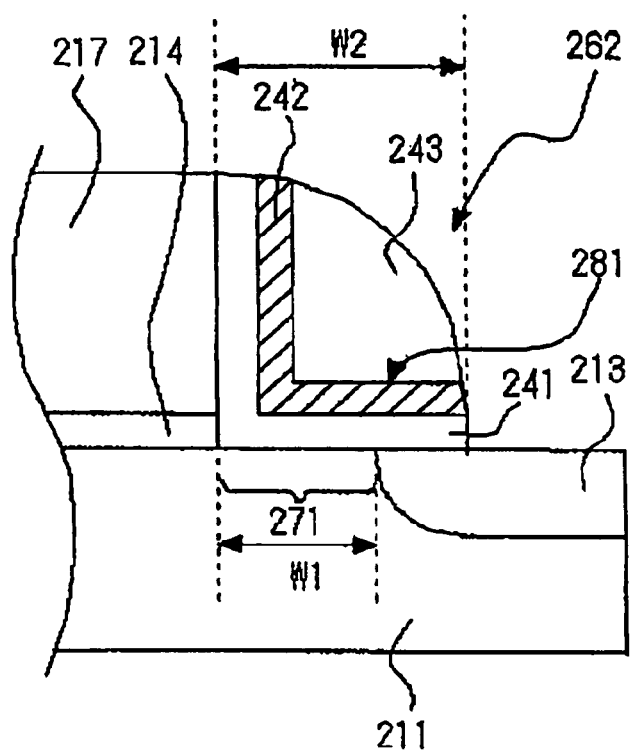
FIG. 9 is a schematic, partially enlarged, cross-sectional view showing the memory element of FIG. 8.

As shown in FIG. 9, in the vicinity of the memory function section 262, an offset amount between the gate electrode 217 and the diffusion region 213 is designated W1, while a width of the memory function section 262 in a cross section along a channel length direction of the gate electrode is designated W2. In this case, an overlap amount between the memory function section 262 and the diffusion region 213 is represented by W2−W1. It is important that the silicon nitride film 242 contained in the memory function section 262 overlaps the diffusion region 213, i.e., the relationship W2>W1 is satisfied.

In FIG. 9, in the memory function section 262, an end of the silicon nitride film 242, which is farther from the gate electrode 217, corresponds to an end of the memory function section 262, which it farther from the gate electrode 217. Therefore, the width of the memory function section 262 is defined as W2.

Figure 10:
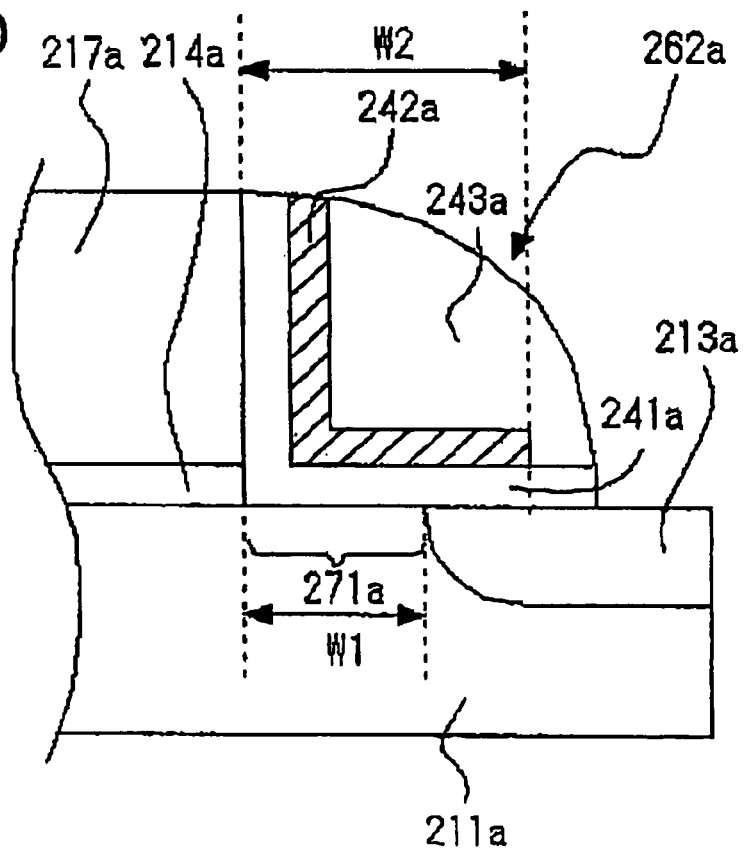
FIG. 10 is a schematic, partially enlarged, arose-sectional view showing a variation of the memory element of FIG. 8.

Note that as shown in FIG. 10, when an end of a silicon nitride film 242a contained in the memory function section 262a, which is farther from, a gate electrode 217a, does not correspond to an end of the memory function section 262a, which is farther from the gate electrode 217a, the width W2 of the memory function section 262a is defined as a distance from an end of the gate electrode 217a to an end of a silicon nitride film 242a which is farther from the gate electrode 217a.

Figure 11:
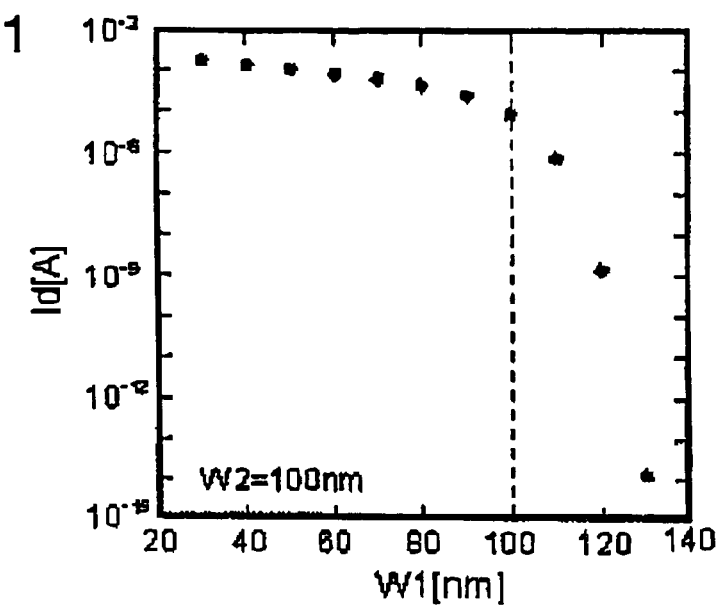
FIG. 11 is a graph showing electric characteristics of a memory element of the semiconductor storage device according to Embodiment 2 of the present invention.

FIG. 11 shows a drain current Id in the memory element structure of FIG. 9 when the width W2 of the memory function section 262 is fixed to 100 nm and the offset amount W1 is changed. In this case, the drain current Id is obtained by performing device simulation, assuming that the memory function section 262 is in an erasure state (holes are accumulated), and the diffusion regions 212 and 213 are a source electrode and a drain electrode, respectively.

As can be clearly seen from FIG. 11, when W1 is equal to or greater than 100 nm (i.e., the silicon nitride film 242 and the diffusion region 213 do not overlap each other), the drain current Id is rapidly decreased. The value of the drain current Id is substantially proportional to the rate of a read operation. Therefore, when W1 is equal to or greater than 100 nm, the performance of the memory is rapidly deteriorated. On the other hand, a decrease in the drain current Id is mild when the silicon nitride film 242 and the diffusion region 213 overlap each other. Therefore, in view of variations in mass production, it is substantially difficult to obtain a memory function unless at least a portion of the silicon nitride film 242 having a function of retaining charges overlaps the source/drain region.

Taking into account the results of the above-described device simulation, a memory cell array was produced where W2 was fixed to 100 nm and W1 was designed to be 60 nm or 100 nm. When W1 was 60 nm, the silicon nitride film 242 and each of the diffusion regions 212 and 213 were designed to overlap each other by 40 nm. When W1 was 100 nm, the silicon nitride film 242 and each of the diffusion regions 212 and 213 were designed not to overlap each other. Read times of these memory cell arrays were measured and the worst oases were compared with each other, taking variations thereof into account. As a result, a read access time was 100 times higher when W1 was designed to be 60 nm than when W1 was designed to be 100 nm. In practical applications, a preferable read access time is 100 nanoseconds or less per bit. In the case of W1=W2, this condition cannot be achieved. When variations due to a manufacturing process is taken into account, (W2−W1)>10 nm is preferably established.

To read information from the memory function section 261 (region 281), preferably, the diffusion region 212 is caused to function as a source electrode, the diffusion region 213 is caused to function as a drain region, and a pinch-off point is provided in a portion of the channel region closer to the drain region, as in Embodiment 1. In other words, when information is read from one of the two memory function sections, a pinch-off point is preferably provided in a region of the channel region closer to the other memory function section. Thereby, it is possible to detect information stored in the memory function section 261 with high sensitivity irrespective of the storing state of the memory function section 262, significantly contributing to achievement of two-bit operations.

On the other hand, when information is stored only in one of the two memory function sections or two memory function sections are used in the same memory state, a pinch-off point is not necessarily provided during a read operation.

Note that, as not shown in FIG. 8, a well region (a P-type well in the case of an N channel element) is preferably provided on a surface of the semiconductor substrate 211. By providing the well region, the impurity concentration of the channel region can be optimized with respect to a memory operation (a rewrite operation and a read operation), thereby facilitating the control of other electric characteristics (e.g., breakdown voltage, junction capacity, short channel effect, etc.).

Figure 12:
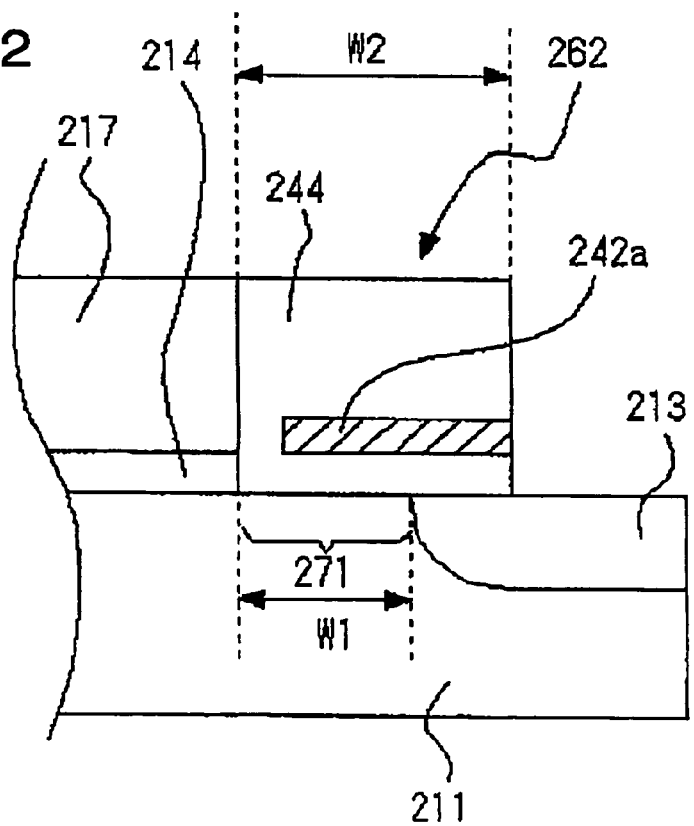
FIG. 12 is a schematic arose-sectional view showing a variation of a memory element of the semiconductor storage device according to Embodiment 2 of the present invention.

In addition, the memory function section preferably comprises a charge retaining film provided substantially parallel to a surface of the gate insulating film. In other words, preferably, an upper surface of the charge retaining film contained in the memory function section is equally spaced from an upper surface of the gate insulating film. Specifically, as shown in FIG. 12, the silicon nitride film 242a (charge retaining film) of the memory function section 262 has a surface substantially parallel to a surface of the gate insulating film 214. In other words, the silicon nitride film 242a is preferably provided at a uniform height above the height of the surface of the gate insulating film 214.

Thus, the memory function section 262 comprises the silicon nitride film 242a substantially parallel to the surface of the gate insulating film 214. Due to this structure, the easiness of formation of an inversion layer in the offset region 271 can be effectively controlled by the more or less of the amount of charges accumulated in the silicon nitride film 242a, thereby increasing the memory effect. In addition, when the silicon nitride film 242a is provided parallel to the surface of the gate insulating film 214, a change in the memory effect can be reduced to a relatively small value even if the offset amount (W1) varies, thereby suppressing a variation in the memory effect. Moreover, the movement of charges toward an upper portion of the silicon nitride film 242a is suppressed, thereby making it possible to suppress a change in characteristics due to the movement of charges during the retaining of a memory.

In addition, preferably, the memory function section 262 comprises an insulating film (e.g., a portion on the offset region 271 of a silicon oxide film 244), which separates the silicon nitride film 242a substantially parallel to the surface of the gate insulating film 214 from the channel region (or a well region). This insulating film suppresses the dissipation of charges accumulated in the charge retaining film, resulting in a memory element having a higher level of ability to retain a memory.

Note that by controlling the film thickness of the silicon nitride film 242a and controlling the film thickness of an insulating film (a portion on the offset region 271 of the silicon oxide film 244) under the silicon nitride film 242a to be constant, a distance from the surface of the semiconductor substrate to charges accumulated in the charge retaining film can be maintained substantially constant. In other words, the distance from the surface of the semiconductor substrate to the charges accumulated in the charge retaining film, can be controlled to be between the minimum film thickness of the insulating film, under the silicon nitride film 242a, and the sum of the maximum film thickness of the insulating film, under the silicon nitride film 242a, and the maximum film thickness of the silicon nitride film 242a. Thereby, the density of electric lines of force generated by charges accumulated in the silicon nitride film 242a can be substantially controlled, thereby considerably reducing a variation in the memory effect of the memory element.

(Embodiment 3)

Figure 13:
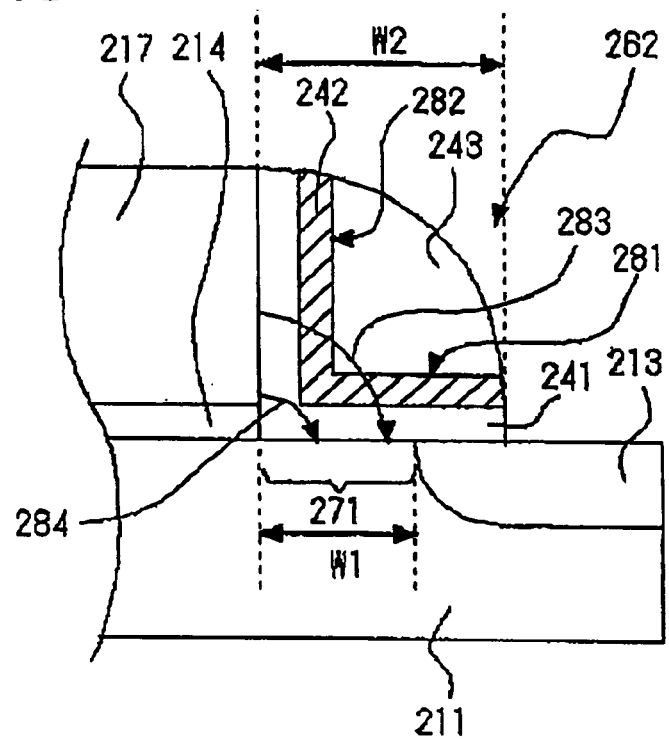
FIG. 13 is a schematic cross-sectional view showing a memory element of a semiconductor storage device according to Embodiment 3 of the present invention.

A memory function section 262 in a semiconductor storage device according to Embodiment 3 of the present invention comprises a silicon nitride film 242 (charge retaining film) which has a substantially uniform film thickness as shown in FIG. 13. The silicon nitride film 242 has a portion (region 281) substantially parallel to a surface of a gate insulating film 214. The silicon nitride film 242 has a portion (region 282) substantially parallel to a side of a gate electrode 217.

When a positive voltage is applied to the gate electrode 217, an electric line of force 283 in the memory function section 262 passes through the silicon nitride film 242 twice (the regions 282 and 281) as shown with an arrow. Note that when a negative voltage is applied to the gate electrode 217, the direction of an electric line of force is reverse. In this case, the relative dielectric constant of the silicon nitride film 242 is about 6, while the relative dielectric constant of the silicon oxide films 241 and 243 to about 4. Therefore, as compared with when only the region 281 (charge retaining film) is provided, the effective relative dielectric constant of the memory function section 262 in the direction of the electric line of force 283 is increased, thereby making it possible to reduce a difference in potential between opposite ends of the electric line of force. In other words, most of a voltage applied to the gate electrode 217 is used to enhance an electronic field in the offset region 271.

The reason charges are implanted into the silicon nitride film 242 during a rewrite operation is that the generated charges are attracted via the electronic field in the offset region 271. Therefore, by providing the charge retaining film indicated by arrow 282, the amount of charges implanted into the memory function section 262 during a rewrite operation is increased, resulting in an increase in a rewriting rate.

Note that when a silicon nitride film is provided instead of the silicon oxide film 243, i.e., the charge retaining film is not uniform with respect to a height corresponding to the surface of the gate insulating film 214, the movement of charges toward an upper portion of the silicon nitride film becomes significant, resulting in a deterioration in the ability to retain a memory.

The charge retaining film may be preferably made of a high dielectric material, such as hafnium oxide or the like, which has a considerably large relative dielectric constant, instead of the silicon nitride film.

In addition, preferably, the memory function section further comprise an insulating film (a portion on the offset region 271 of the silicon oxide film 241) which separates the charge retaining film substantially parallel to the surface of the gate insulating film from the channel region (or the well region). This insulating film suppresses the dissipation of charges accumulated in the charge retaining film, thereby further improving the ability to retain a memory.

In addition, preferably, the memory function section further comprises an insulating film (a portion adjacent to the gate electrode 217 of the silicon oxide film 241) which separates the gate electrode from the charge retaining film extending in a direction substantially parallel to a side of the gate electrode. This insulating film prevents charges from being implanted from the gate electrode to the charge retaining film, so that electric characteristics are not changed, thereby making it possible to improve the reliability of the memory element.

Moreover, as in Embodiment 2, the film thickness of the insulating film (a portion on the offset region 271 of the silicon oxide film 241) under the silicon nitride film 242 is preferably controlled to be constant. Also, as in Embodiment 2, the film thickness of the insulating film (a portion adjacent to the gate electrode 217 of the silicon oxide film 241) on a side of the gate electrode is preferably controlled to be constant. Thereby, the density of electric lines of force generated by charges accumulated in the silicon nitride film 242 can be substantially controlled, and the leakage of charges can be prevented.

(Embodiment 4)

In Embodiment 4, optimization of distances between a gate electrode, a memory function section, and source/drain regions in a memory element of a semiconductor storage device will be described below.

Figure 14:
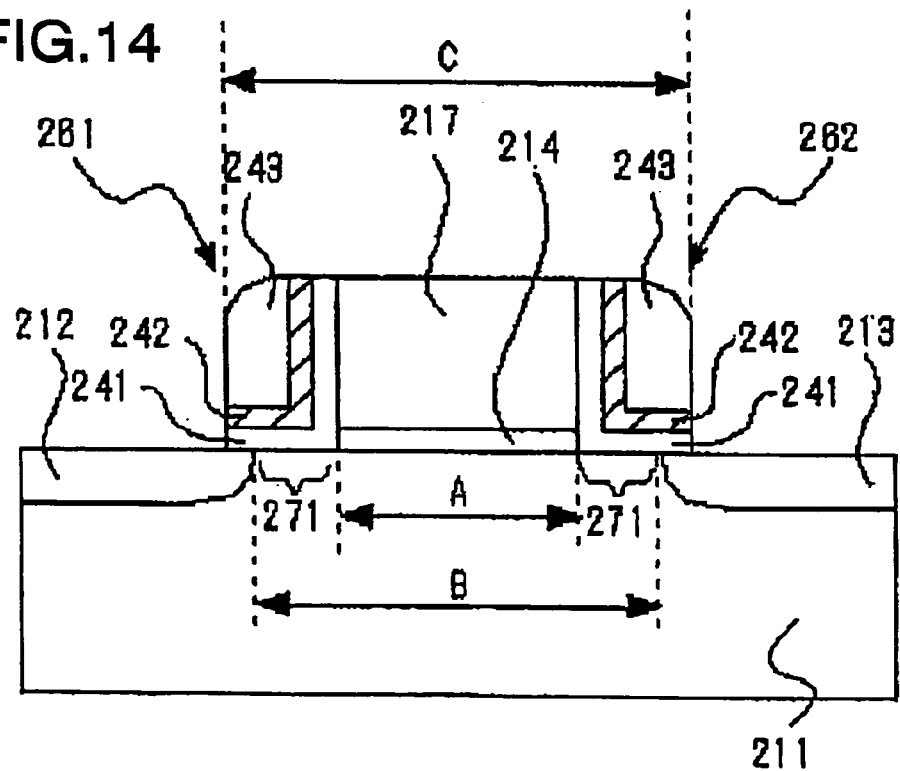
FIG. 14 is a schematic cross-sectional view showing a memory element of a semiconductor storage device according to Embodiment 4 of the present invention.

As shown in FIG. 14, A indicates a length of a gate electrode in a cross-section taken along a channel length direction; B indicates a distance between source/drain regions (channel length); and C indicates a distance from an end of one memory function section to an end of the other memory function section, i.e., from an end (a farther end from the gate electrode) of a film having a function of retaining charges in one memory function section to an end (a farther end from the gate electrode) of a film having a function of retaining charges in the other memory function section in the cross-section taken along the channel length direction.

In the above-described memory element, B<C is preferable. When such a relationship is satisfied, an offset region 271 exists between a portion under a gate electrode 217 of a channel region and diffusion regions 212 and 213. Thereby, the easiness of inversion effectively varies throughout the offset region 271 due to charges accumulated in the memory function sections 261 and 262 (silicon nitride film 242). Therefore, the memory effect is increased, particularly resulting in a high-rate read operation.

When the diffusion regions 212 and 213 are offset from the gate electrode 217, i.e., A<B is satisfied, the easiness of inversion of the offset region when a voltage is applied to the gate electrode 217 is significantly changed, depending on the amount of charges accumulated in the memory function section. The memory effect can be enhanced while the short channel effect can be reduced.

Note that the offset region 271 may not be necessarily required as long as the memory effect is obtained. Even when the offset region 271 is not provided, the memory effect may be obtained in the memory function sections 261 and 262 (the silicon nitride film 242) if the impurity concentration of the diffusion regions 212 and 213 are sufficiently low.

Accordingly, A<B<C is moot preferable.

(Embodiment 5)

Figure 15:
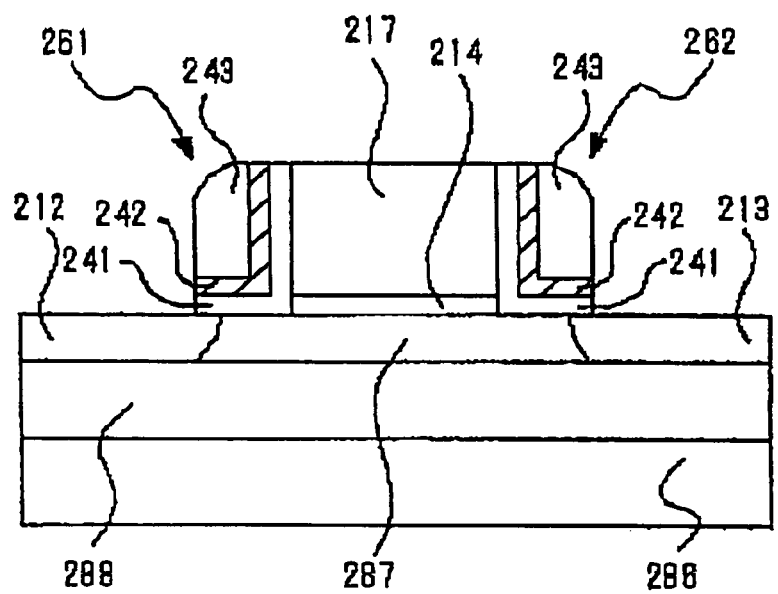
FIG. 15 is a schematic cross-sectional view showing a memory element of a semiconductor storage device according to Embodiment 5 of the present invention.

A memory element of a semiconductor storage device according to Embodiment 5 of the present invention has substantially the same structure as that of the memory element of Embodiment 2, except that the semiconductor substrate is an SOI substrate as shown in FIG. 15.

In this memory element, a buried oxide film 288 is provided on semiconductor substrate 286. An SOI layer is provided on the buried oxide film 288. Diffusion regions 212 and 213 are provided in the SOI layer, and the other region of the SOI layer is a body region 287.

This memory element has an action and effect similar to those of the memory element of Embodiment 2. In addition, the junction capacity between the diffusion regions 212 and 213 and the body region 287 can be significantly reduced, thereby making it possible to increase the speed of the element and reduce the power consumption thereof.

(Embodiment 6)

Figure 16:
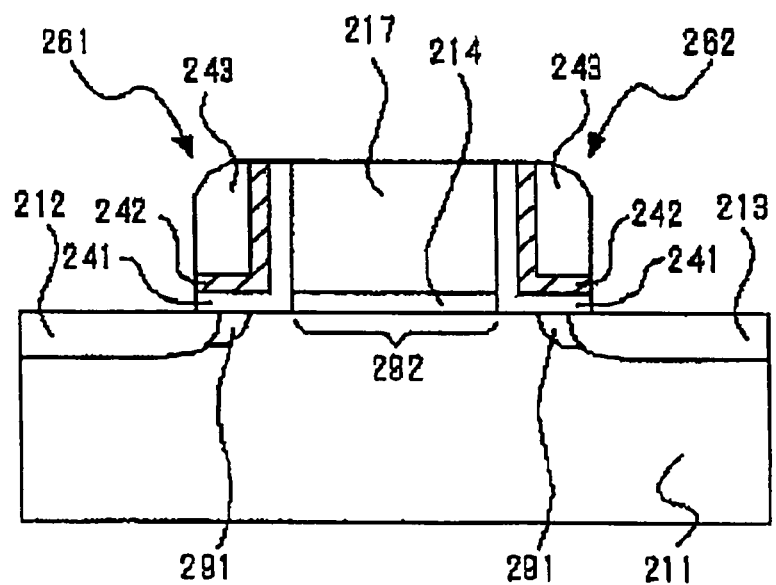
FIG. 16 is a schematic cross-sectional view showing a memory element of a semiconductor storage device according to Embodiment 6 of the present invention.

A memory element of a semiconductor storage device according to Embodiment 6 of the present invention has substantially the same structure as that of the memory element of Embodiment 2 except that a P-type high concentration region 291 is added to a channel side of the N-type diffusion regions 212 and 213 as shown in FIG. 16.

Specifically, the P-type high concentration region 291 has a higher impurity (e.g., boron, etc.) concentration, which provides a P-type, than the impurity concentration of a region 292, which provides a P-type. An appropriate P-type impurity concentration of the P-type high concentration region 291 is, for example, about $5 \times 10^{17}$ cm$^{-3}$ to about $1 \times 10^{19}$ cm$^{-3}$. The P-type impurity concentration of the region 292 is, for example, $5 \times 10^{16}$ to $1 \times 10^{18}$ cm$^{-3}$.

Thus, by providing the P-type high concentration region 291, the junction between the diffusion regions 212 and 213 and the semiconductor substrate 211 is steep directly under the memory function sections 261 and 262. Therefore, hot carriers are easily generated during write and erase operations, so that a voltage required for write and erase operations can be reduced, or the speed of write and erase operations can be increased. Moreover, since the impurity concentration of the region 292 is relatively low, the threshold is low when the memory element is in the erasure state, so that the drain current is increased. Therefore, the read rate is improved. As a result, it is possible to obtain a memory element having a low rewriting voltage or a high rewriting rate, and a high read rate.

In FIG. 16, by providing the P-type high concentration region 291 in the vicinity of a source/drain region and under a memory function section (i.e., not directly under the gate electrode), the threshold of the whole transistor is significantly increased. The degree of this increase is significantly large as compared with when the P-type high concentration region 291 is located directly under the gate electrode. When writing charges (electrons in the case where the transistor is of an N channel type) are accumulated in the memory function section, the degree of the increase is more significant. On the other hand, when a sufficient amount of erasure charges (holes in the case where the transistor is of an N channel type) are accumulated in the memory function section, the threshold of the whole transistor is reduced to a threshold, which is determined depending on the impurity concentration of the channel region (region 292) under the gate electrode. In other words, the erasure threshold does not depend on the impurity concentration of the P-type high concentration region 291. In contrast, the writing threshold is considerably significantly influenced. Therefore, by providing the P-type high concentration region 291 under the memory function section and in the vicinity of the source/drain region, only the writing threshold considerably significantly varies, and the memory effect (a difference in threshold between write and erase operations) is significantly increased.

(Embodiment 7)

Figure 17:
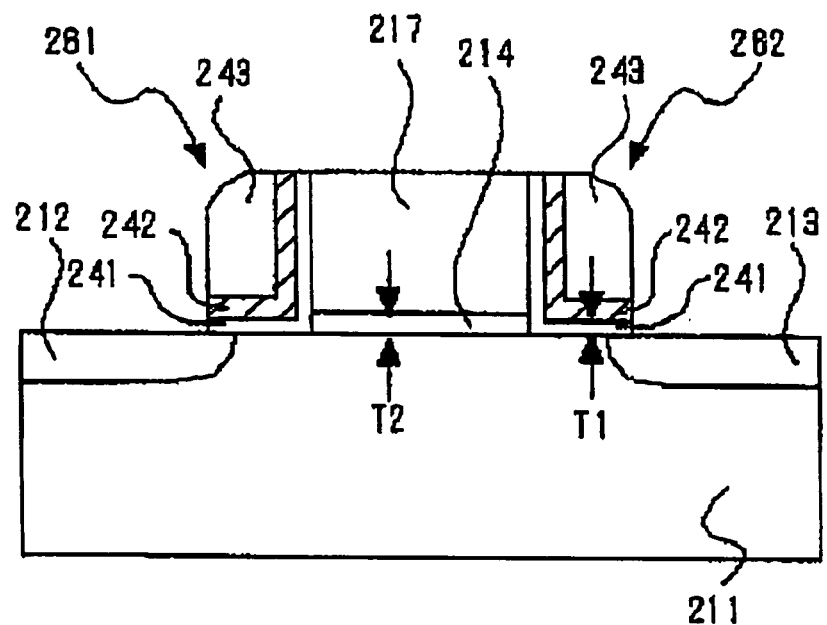
FIG. 17 is a schematic cross-sectional view showing a memory element of a semiconductor storage device according to Embodiment 7 of the present invention.

A memory element of a semiconductor storage device according to Embodiment 7 of the present invention has substantially the same structure as that of the memory element of Embodiment 2, except that the thickness (T1) of an insulating film separating a charge retaining film (a silicon nitride film 242) from a channel region or a well region, is smaller than the thickness (T2) of a gate insulating film as shown in FIG. 17.

The thickness (T2) of a gate insulating film 214 has a lower limit because of the requirement for a breakdown voltage during a memory rewrite operation. However, the thickness (T1) of the insulating film can be smaller than T2 irrespective of the requirement for a breakdown voltage.

In this memory element, the reason the degree of freedom of designing T1 is high as described above, to as follows.

In this memory element, the insulating film separating the charge retaining film from the channel region or the well region, is not interposed between the gate electrode and the channel region or the well region. Therefore, a high electronic field applying between the gate electrode and the channel region or the well region does not act directly on the insulating film separating the charge retaining film from the channel region or the well region. Instead, there is a relatively weak electronic field spreading horizontally from the gate electrode. Therefore, T1 can be smaller than T2 irrespective of the requirement for a breakdown voltage to the gate insulating film.

By decreasing T1, it can be made easier to implant charges into a memory function section, so that a voltage required for writing and erase operations can be lowered, or the speed of writing and erase operations can be increased. In addition, when charges are accumulated in a silicon nitride film 242, the amount of charges induced by the channel region or the well region is increased, thereby making it possible to enhance the memory effect.

Among the electric lines of force in the memory function section, there is a short electric line of force, which does not pass through the silicon nitride film 242, as shown with arrow 284 in FIG. 13. The intensity of an electronic field on such a short electric line of force is relatively great, and therefore, the electronic field along the electric line of force plays a significant role in a rewrite operation. By decreasing T1, the silicon nitride film 242 is shifted toward the bottom of the figure, so that the electric line of force indicated by arrow 283 passes through the silicon nitride film. Therefore, the effective relative dielectric constant along the electric line of force 284 in the memory function section is increased, thereby making it possible to reduce a difference in potential between opposite ends of the electric line of force. Therefore, most of a voltage applied to a gate electrode 217 is used so as to enhance an electronic field in an offset region, resulting in high-speed writing and erase operations.

In contrast to this, for example, EEPROM, such as, representatively, a flash memory or the like, comprises an insulating film separating a floating gate from a channel region or a well region, which is interposed between a gate electrode (control gate) and the channel region or the well region. A high electronic field directly acts from the gate electrode onto the insulating film. Therefore, in EEPROM, the thickness of the insulating film separating the floating gate from the channel region or the well region is limited, so that the optimization of the function of a memory element is inhibited.

As is clearly understood from the above description, by setting T1<T2, the voltage required for write and erase operations can be reduced, or the speed of writing and erase operations can be increased, and the memory effect con be enhanced, without reducing the ability of a memory element to withstand with voltage. Note that the thickness T1 of the insulating film is preferably equal to or greater than 0.8 nm, in which range the thickness T1 can maintain a prescribed level of uniformity or film quality during manufacturing processes, and the ability to retain a memory is not considerably deteriorated, Specifically, in the case of a liquid crystal driver LSI which has a high withstand voltage in a design rule, a maximum voltage of 15 to 18 V is required to drive a liquid crystal panel TFT. Therefore, generally, a thin gate oxide film cannot be obtained. When a non-volatile memory of the present invention for adjusting images is incorporated into a liquid crystal driver LSI, the thickness of the insulating film separating the charge retaining film (silicon nitride film 242) from the channel region or the well region can be designed to be optimized, independently of the thickness of the gate insulating film, in the memory element of the present invention. For example, in a memory cell having a gate electrode length (word line width) of 250 nm, T1 and T2 are separately determined to be 20 nm and 10 nm, respectively. Thereby, a memory cell having a satisfactory level of writing efficiency can be obtained. (The reason a short channel effect does not occur even when T1 is greater than the thickness of typical logic transistors, is that a source/drain region to off set from the gate electrode).

(Embodiment 8)

Figure 18:
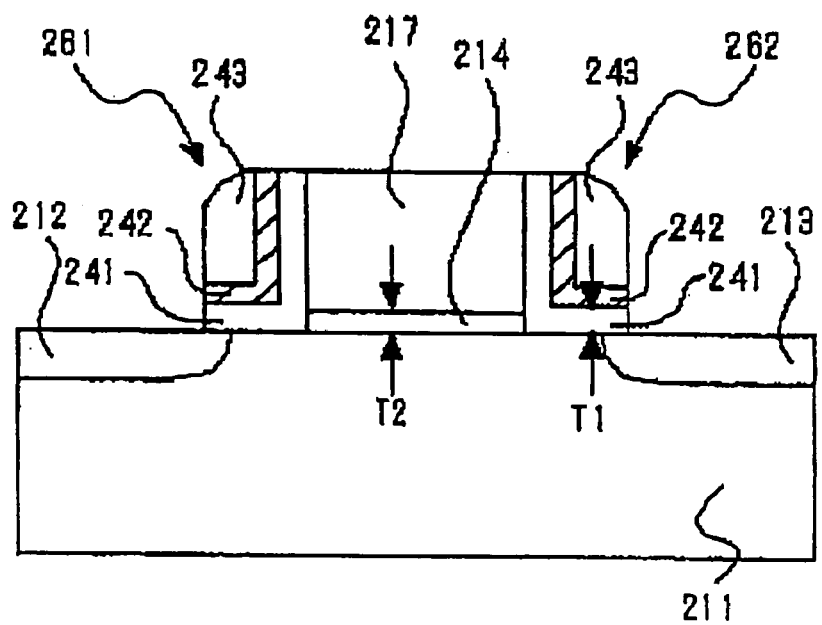
FIG. 18 is a schematic cross-sectional view showing a memory element of a semiconductor storage device according to Embodiment 8 of the present invention.

A memory element of a semiconductor storage device according to Embodiment 8 of the present invention has substantially the same structure as that of Embodiment 2, except that a thickness (T1) of an insulating film separating a charge retaining film (silicon nitride film 242) from a channel region or a well region is greater than a thickness (T2) of a gate insulating film as shown in FIG. 18.

The thickness (T2) of the gate insulating film 214 has an upper limit value due to the requirement of prevention of a short channel effect of the memory element. However, the thickness (T1) of the insulating film can be made greater than T2 irrespective of the requirement of prevention of a short channel effect. Thus, the thickness of the insulating film separating the charge retaining film (silicon nitride film 242) from the channel region or the well region can be optimized, independently of the thickness of the gate insulating film. Therefore, when the degree of scaling of miniaturization is increased (the gate insulating film becomes thinner), the memory function section does not obstruct the scaling.

In this memory element, the reason that the degree of freedom of design of T1 is high, is that the insulating film separating the charge retaining film from the channel region or the well region is not interposed between the gate electrode and the channel region or the well region, as described above. Therefore, it is possible to make T1 greater than T2 irrespective of the requirement of prevention of a short channel effect for the gate insulating film.

By increasing T1, the dissipation of charges accumulated in the memory function section can be prevented, thereby improving the ability to retain a memory.

Therefore, by setting T1>T2, the ability to retain a memory can be improved without deteriorating the short channel effect of the memory element.

Note that the thickness (T1) of the insulating film is preferably 20 nm or less, taking a reduction in the rewriting rate into consideration.

Specifically, in a non-volatile memory, such as, representatively, a flash memory or the like, a selection gate electrode is a writing/erasure gate electrode and a gate insulating film (including a floating gate) corresponding to the writing/erasure gate electrode also functions as a charge accumulation film. Therefore, the requirement for miniaturization (a thin film is essential for suppression of a short channel effect) is contrary to the requirement for reliability (to suppress leakage of retained charges, the insulating film separating the floating gate from the channel region or the well region cannot be equal to or less than about 7 nm). Therefore, miniaturization is difficult. In fact, ITRS (International Technology Roadmap for Semiconductors) shows that there is no prospect that the physical length of a gate is miniaturized to about 0.2 µm or less. In this memory element, T1 and T2 can be separately designed as described above, thereby making it possible to realize miniaturization.

For example, for a memory cell having a gate electrode length (word line width) of 45 nm, T2 and T1 are separately set to be 4 nm and 7 nm, respectively, thereby making it possible to realize a memory element free from a short channel effect. The reason a short channel effect does not occur even when T2 is greater than the thickness of typical logic transistors, is that a source/drain region is offset from the gate electrode.

Since a source/drain region is offset from the gate electrode in the memory element, miniaturization is easier as compared with typical logic transistors.

Thus, there is no electrode for aiding write and erase operations on an upper portion of the memory function section. Therefore, a high electronic field applied between an electrode for aiding write and erase operations and the channel region or the well region does not act directly on the insulating film separating the charge retaining film from the channel region or the well region. Only a relatively weak electronic field, which spreads horizontally from the gate electrode acts on the insulating film. Therefore, it is possible to realize a memory element having a gate length smaller than that of logic transistors for the same process generation.

(Embodiment 9)

Embodiment 9 relates to a change in electric characteristics of a memory element of a semiconductor storage device of the present invention when rewriting is performed.

Figure 19:
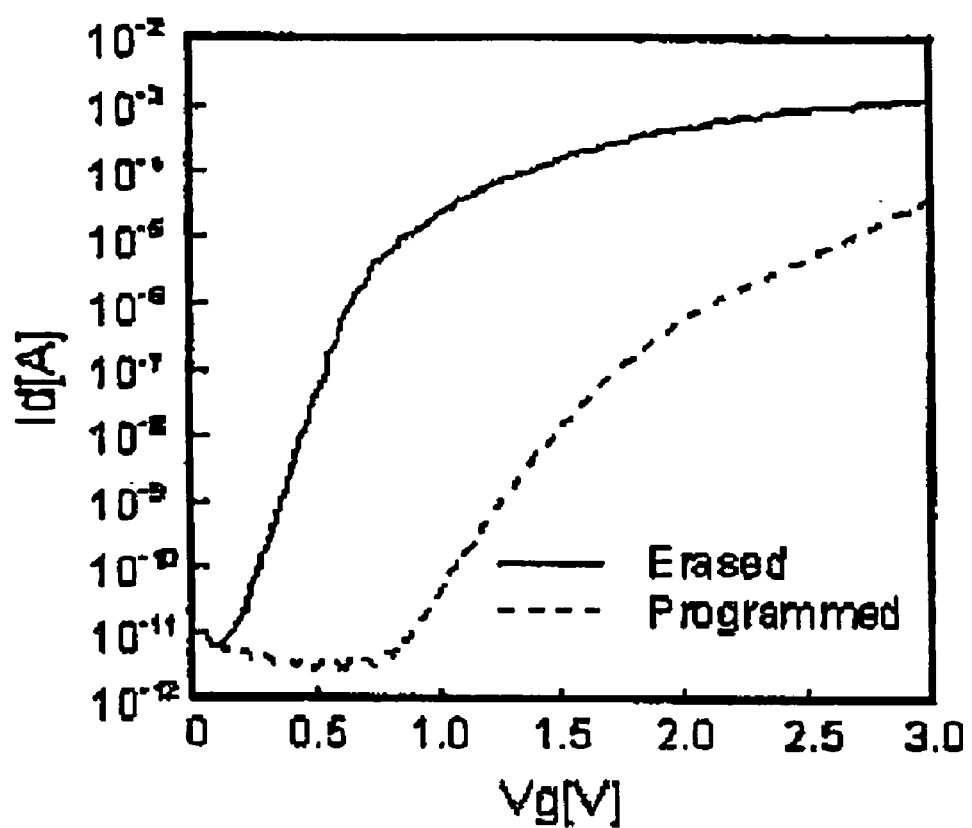
FIG. 19 is a graph showing electric characteristics of a memory element of a semiconductor storage device according to Embodiment 9 of the present invention.

FIG. 19 shows drain current (Id) vs. gate voltage (Vg) characteristics (actual measured values) of an N-channel type memory element when the amount of charges in a memory function section is changed.

Figure 31:
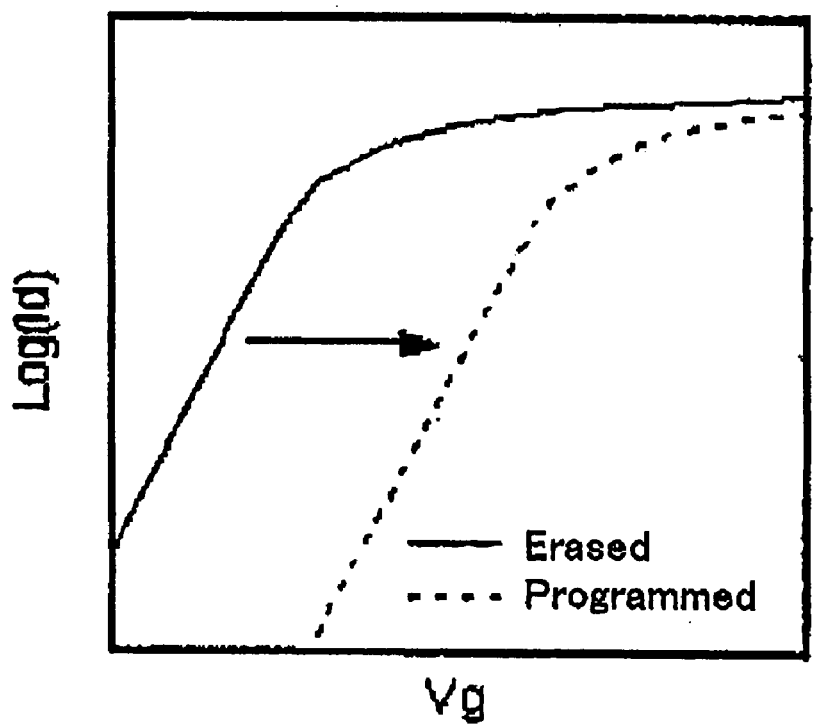
FIG. 31 is a graph showing electric characteristics of a conventional flash memory.

As can be seen from FIG. 19, when writing is performed from an erasure state (solid line), not only a threshold increases, but also the gradient of the graph is significantly reduced particularly in a subthreshold region. Therefore, even in a region having a relatively high gate voltage (Vg), the drain current ratio between the erasure state and the writing state is large. For example, even at Vg=2.5 V, the current ratio is about $10^2$ or more. These characteristics are significantly different from those of flash memories (FIG. 31).

The emergence of such characteristics is a peculiar phenomenon which occurs because the gate electrode and the diffusion region are offset from each other and a gate electronic field is unlikely to reach the offset region. When the memory element is in a writing state, an inversion layer is considerably unlikely to occur in the offset region under the memory function section even if a positive voltage is applied to the gate electrode. This is responsible for the small gradient of the Id-Vg curve at the subthreshold region in the writing state.

When the memory element is in an erasure state, electrons are induced in the offset region with high density. Further, when a voltage of 0 V is applied to the gate electrode (i.e., OFF state), electrons are not induced in a channel under the gate electrode (therefore, an off current is small). For this reason, the gradient of the Id-Vg curve in the subthreshold region is large in the erasure state, and the increasing rate of a current (conductance) is high even in a region equal to or higher than the threshold.

As can be seen from the above description, the memory element contained in the semiconductor storage apparatus of the present invention can have a particularly large drain current ratio between write and erase operations.

(Embodiment 10)

Embodiment 10 relates to a semiconductor storage device comprising a plurality of memory elements of Embodiments 1 to 8 and circuits for rewrite and read operations, and a method for operating the device.

Figure 20:
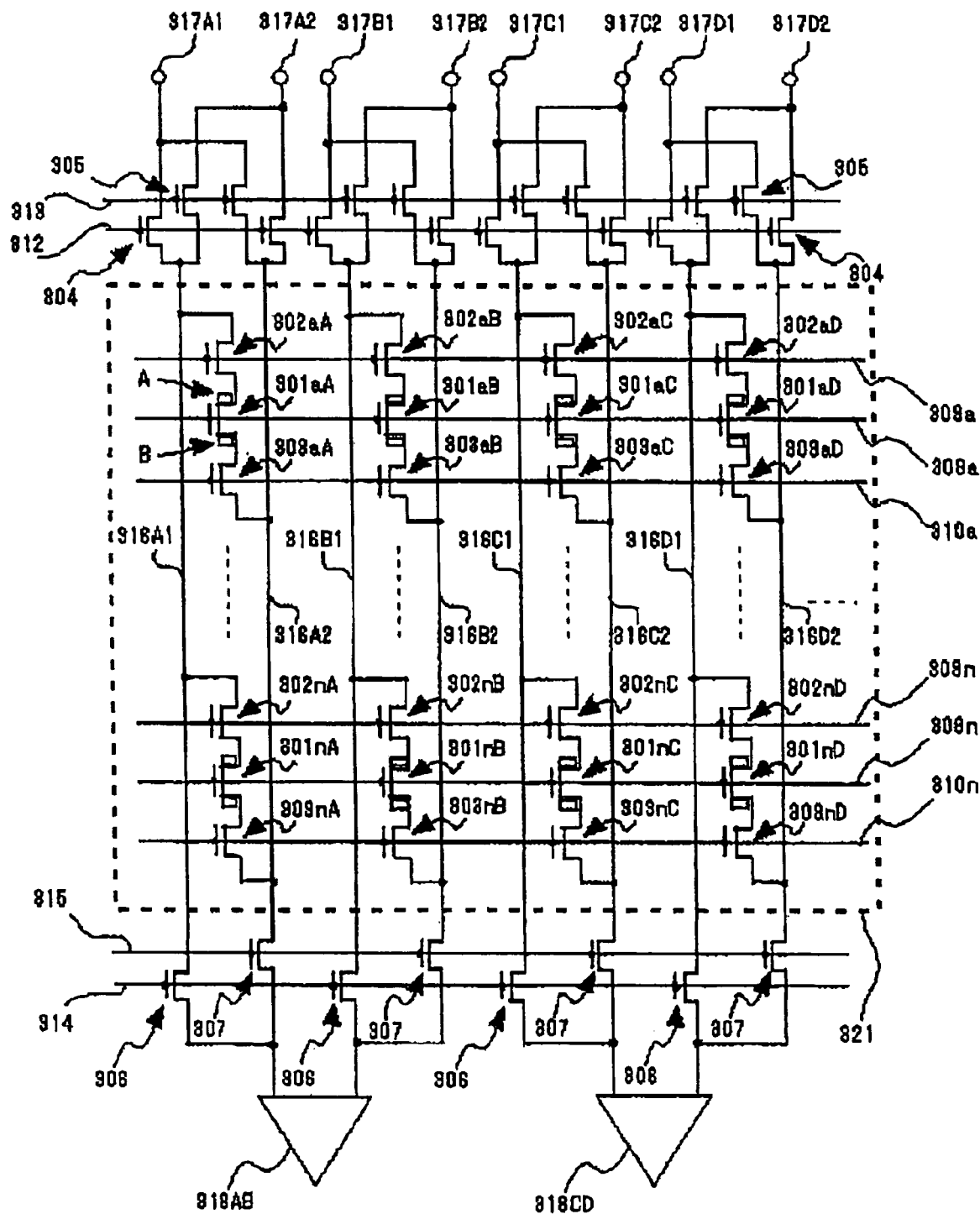
FIG. 20 is a circuit diagram showing a semiconductor storage device according to Embodiment 10 of the present invention.

FIG. 20 is a circuit diagram showing this semiconductor storage device. The semiconductor storage device comprises a memory element array region 321, a circuit portion for applying a prescribed rewriting voltage or a prescribed read voltage to each memory element, a sense amplifier, and a circuit portion for connecting the sense amplifier and the memory element. Note that other peripheral circuits are omitted from FIG. 20.

The semiconductor storage device has a portion 321, in which memory elements 301aA to 301aD, . . . , and 301nA to 301nD of Embodiments 1 to 8. Each memory element has two memory function sections. For example, the two memory function sections in the memory element 301aA are indicated with arrows A and B.

A selection transistor is connected to each of the opposite sides of each memory element, i.e., two selection transistors are connected to each memory element. For example, selection transistors 302aA and 303aA are connected to the memory element 301aA in series.

The gate electrodes of the memory elements 301aA to 301aD are connected via a word line 308a. The gate electrodes of other memory elements are similarly connected via word lines. The selection transistors 302aA to 302aD are connected via a selection transistor word line 309a. The selection transistors 303aA to 303aD are connected via a selection transistor word line 310a. The gate electrodes of the other selection translators are similarly connected via selection transistor word lines.

The selection transistor 302aA to 302nA are each connected to a first bit line 316A1. The selection translator 303aA to 303nA are each connected to a second bit line 316A2. The other selection translators are similarly connected to a first or second bit line.

Each bit line is connected to a pair of operation selecting transistors 304 and 305. The operation selecting transistors 304 and 305 are connected to first voltage input terminals 317A1 to 317D1 and second voltage input terminals 317A2 to 317D2, respectively. The gate electrodes of the operation selecting transistors 304 and 305 are connected to operation selection line 312 and 313, respectively. With such wiring, when the operation selection line 312 is selected, for example, the first bit line 316A1 is connected to the first voltage input terminal 317A1 and the second bit line 316A2 is connected to the second voltage input terminal 317A2. When the operation selection line 313 is selected, for example, the first bit line 316A1 is connected to the second voltage input terminal 317A2 and the second bit line 316A2 is connected to the first voltage input terminal 317A1. Thus, a pair of the bit lines 316A1 and 316A2 are connected to different voltage input terminals. By selecting a different operation selection line, a voltage input terminal to be connected can be exchanged.

Two pairs of bit lines (e.g., a pair of bit lines 316A1 and 316A2 and a pair of bit lines 316B1 and 316B2) are connected via a switching transistor to one and the other input of a sense amplifier having two inputs, respectively. The connection will be described below more specifically.

The first bit line 316A1 to 316D1 are each connected to a first switching transistor 306. The second bit line 316A2 to 316D2 are each connected to a second switching transistor 307. The gate electrodes of the switching transistors 306 and 307 are connected to switching transistor selection lines 314 and 315, respectively. With such wiring, when the switching transistor selection line 314 is selected, for example, one input of a sense amplifier 318AB is connected to the first bit line 316A1, while the other input of the sense amplifier 318AB is connected to the first bit line 316B1. When the switching transistor selection line 315 to selected, for example, one input of the sense amplifier 318AB is connected to the second bit line 316A2, while the other input of the sense amplifier 318AB is connected to the first bit line 316B2.

Note that any amplifier capable of detecting a current output from a memory element can be used as a sense amplifier. For example, a differential amplifier can be used.

Although four pairs of bit lines are provided in FIG. 20, any number of pairs of bit lines can be provided, In FIG. 20, two pairs of bit lines are connected to one sense amplifier. This is because two selected memory elements are paired and connected to one and the other input of one sense amplifier.

In another example, in which a memory element is applied to such a semiconductor storage device, one memory element may be connected to one input of a sense amplifier, while an external reference cell may be connected to the other input of the sense amplifier.

A method for operating the above-described semiconductor storage device will be described below. The semiconductor storage apparatus has a rewrite operation and a read operation. The rewrite operation includes a write operation and a read operation.

Firstly, a method for a write operation will be described. As an exemplary write operation, writing information into the memory element 301aA will be described.

The operation selection line 312 is selected to switch the operation selecting transistor 304 into the ON state. Thereby, for example, the first bit line 316A1 is connected to the first voltage input terminal 317A1, while the second bit line 316A2 is connected to the second voltage input terminal 317A2. The same is true of the other bit lines.

In addition, the selection transistor word lines 309a and 310a are selected. As a result, one (memory function section A) of the diffusion regions (source/drain) of the memory element 301aA is connected to the first voltage input terminal 317A1, while the other (memory function section B) is connected to the second voltage input terminal 317A2. The same is true of the memory element 301aB to 301aD connected to the word line 308a.

Prescribed voltages for writing are applied to the word line 308a and the first and second voltage input terminals 317A1 and 317A2. A voltage of, for example, +5 V is applied to the word line 308a. A voltage of +5 V is applied to the first voltage input terminal 317A1, and a voltage of 0 V is applied to the second voltage input terminal 317A2. As a result, writing is selectively performed in the memory function section A of the memory element 301aA.

In this case, if prescribed voltages are applied to other voltage input terminals, writing can also be performed for the memory elements 301aB to 301aD. For memory elements in which writing is not to be performed, a voltage of 0 V is input to the voltage input terminal or the voltage input terminal is set to be in an open state.

To perform writing for the memory function section B of the memory element 301aA, the selection line 313 is selected instead of the operation selection is line 312, where the other selection operations and applied voltage conditions are similarly determined. A voltage applied to the first voltage input terminal 317A1 may be exchanged with a voltage applied to the second voltage input terminal 317A2.

Next, a method for an erase operation will be described. As an exemplary erase operation, erasure of the memory element 301aA will be described below.

As in the write operation, the operation selection line 312 is selected, the operation selecting transistor 304 is switched into the ON state, and the selection transistor word lines 309a and 310a are selected.

Prescribed voltages for erasure are applied to the word line 308a and the first and second voltage input terminals 317A1 and 317A2. A voltage of −5 V is applied to the word line 308a. A voltage of +5 V is applied to the first voltage input terminal 317A1. A voltage of 0 V is applied to the second voltage input terminal 317A2. As a result, the memory function section A of the memory element 301aA is selectively erased.

In this case, if prescribed voltages are applied to the other voltage input terminals, the memory element 301aB to 301aD can be erased. For memory elements not to be erased, a voltage of 0 V is applied to the voltage input terminals thereof, or the voltage input terminals thereof are set to be in the open state.

To perform erasure for the memory function section B of the memory element 301aA, the selection line 313 is selected instead of the operation selection line 312, where the other selection operations and applied voltage conditions are similarly determined. A voltage applied to the first voltage input terminal 317A1 may be exchanged with a voltage applied to the second voltage input terminal 317A2.

Next, a method for a read operation will be described. As an exemplary read operation, reading of information stored in the memory element 301aA will be described.

To read stored information from the memory function section A of the memory element 301aA, the operation selection line 313 is selected, the operation selecting transistor 305 is switched into the ON state, and the switching transistor selection line 314 is selected to switch the first switching transistor 306 into the ON state. Further, a voltage appropriate for a read operation (e.g., +2 V) is applied to the word line 308a. A voltage of, for example, +1.8 V is applied to the first voltage input terminal 317A1. The second voltage input terminal 317A2 is in an open state.

According to the above-described selecting operation and applied voltage conditions, a current frows from the first voltage input terminal 317A1 and then via the memory element 301aA to one input of the sense amplifier 318AB. By detecting a value of the current, information stored in the memory element 301aA can be determined. In this case, the memory function section A of the memory element 301aA serves as a source. Therefore, the value of the current passing through the memory element 301aA is affected mainly by the more or less of the amount of charges accumulated in the memory function section A. Therefore, only information stored in the memory function section A can be selectively read out.

As described in Embodiment 9, in the semiconductor storage device of the present invention, a memory element can have a particularly large drain current ratio between write and erase operations, whereby a writing state and an erasure state can be easily distinguished from each other.

To read information stored in the memory function section B of the memory element 301aA, the operation selection line 312 is selected instead of the operation selection line 313, the switching transistor selection line 315 is selected instead of the switching transistor selection line 314, and the other selecting operations and applied voltage conditions are similarly determined.

During the read operation, by additionally applying a voltage of, for example, +1.8 V for a read operation to the first voltage input terminal 317B1, a current corresponding to information stored in the memory element 301aB is supplied to the other input of the sense amplifier 318AB. Therefore, in Embodiment 10, the sense amplifier 318AB can detect a difference between currents passing through the two memory elements 301aA and 301aB. In this case, two memory elements are used to store one bit or two bits of information. As described above concerning a read operation, when the direction of a current passing through a memory element during a read operation is reversed, and information stored in the memory function section A and information stored in the memory function section B are separately read out, the two memory elements can be used to perform a two-bit operation. Alternatively, by limiting the direction of a current passing through a memory element during a read operation only to one direction, two memory elements can be used to perform a one-bit operation.

FIG. 21 shows a conceptual diagram of a two-bit operation performed by two memory elements. In FIG. 21, for example, memory elements 601A and 601B, and a sense amplifier 618AB1 (618AB2) correspond to the memory elements 301aA and 301aB, and the sense amplifier 318AB of FIG. 20, respectively. Elements provided between the memory element and the sense amplifier are not shown in FIG. 21. Although two sense amplifiers 618AB1 and 618AB2 are shown in FIG. 21, a switching transistor and an operation selecting transistor may be used to switch a connection between a single sense amplifier and a memory element as in the semiconductor storage device of FIG. 20.

(a) to (d) of FIG. 21 indicate four possible states (two bits) of a set of two memory cells. In each case, two inputs of each sense amplifier receive currents corresponding to opposing stored information, such as L and H or N and L. Therefore, by detecting a difference between these currents, stored information can be read out.

FIG. 22 shows a conceptual diagram of a one-bit operation performed by two memory elements. In this case, the direction of a current passing through a memory element during a read operation is not reversed. Therefore, only a single sense amplifier 618AB is shown. (a) and (b) of FIG. 22 show two possible states (one bit) of a set of two memory cells. In each case, two inputs of each sense amplifier receive currents corresponding to opposing stored information, such as L and H or H and L. In addition, as shown in FIG. 22, two memory function sections contained in one memory element preferably stores the same information. In this case, the reliability of a read operation can be improved.

When a single memory element is connected to one input of a sense amplifier while an external reference device is connected to the other input of the sense amplifier, the single memory element can store two bits of information.

However, the outputs of two memory elements (memory element pair) are preferably input to the same sense amplifier, as in Embodiment 10. With such a structure, by detecting a difference between currents passing through two memory elements having a similar device structure, information stored in the memory element can be read out. On the other hand, for example, when a transistor having a typical structure is used as an external reference, a difference in temperature characteristics between the memory element and the transistor having a typical structure reduces the reliability of a read operation. Therefore, by supplying the outputs of a memory element pair to the same sense amplifier, the reliability of a read operation can be improved.

In the semiconductor storage device of this embodiment, a selection transistor is connected to each of the opposite sides of each memory element, i.e., two selection transistors is connected to each memory element. Therefore, during a rewrite operation, a rewriting voltage applied on a bit line is applied to the only selected memory element, and the voltage is not applied to the other memory elements connected to the same bit line pair. Therefore, it is possible to prevent erroneous rewriting of non-selected cells during a rewrite operation.

In typical memory cells, off currents of non-selected cells are added to a read current of a selected cell during a read operation, so that the reliability of a read operation to reduced. Such a problem is reduced by the present invention, particularly when the number of word lines is large and the number of cello connected to the same bit line pair is large.

Note that even when a single selection translator is provided only on one side of each memory element, it is possible to reduce off current of non-selected calls during a read operation.

The word lines 308*a* to 308*n*, for example, can be formed by using upper metal conductor lines, which are connected to the gate electrode of each memory element. Preferably, the gate electrodes of memory elements (at least a pair of memory elements) collectively function as a word line, and the memory function sections of a memory element pair are collectively shared on the opposite aides of the gate electrode. For example, a linear polysilicon electrode extends over active regions of a plurality of semiconductor layers. When the polysilicon electrode is separated from the active region of a semiconductor layer via a gate insulating film, the polysilicon functions as a gate electrode on each active region, and the linear polysilicon electrode itself functions as a word line. In this case, a contact which connects the gate electrode with the upper metal conductor line can be significantly reduced, thereby improving the scale of integration of a semiconductor storage device. In addition, since the gate electrodes share a memory function section, it is not necessary to separate memory function sections for each memory element. Therefore, the manufacturing process can be simplified and an inexpensive and reliable semiconductor storage device can be obtained.

In the semiconductor storage device of Embodiment 10, logic transistors are preferably integrated together.

Figure 25:
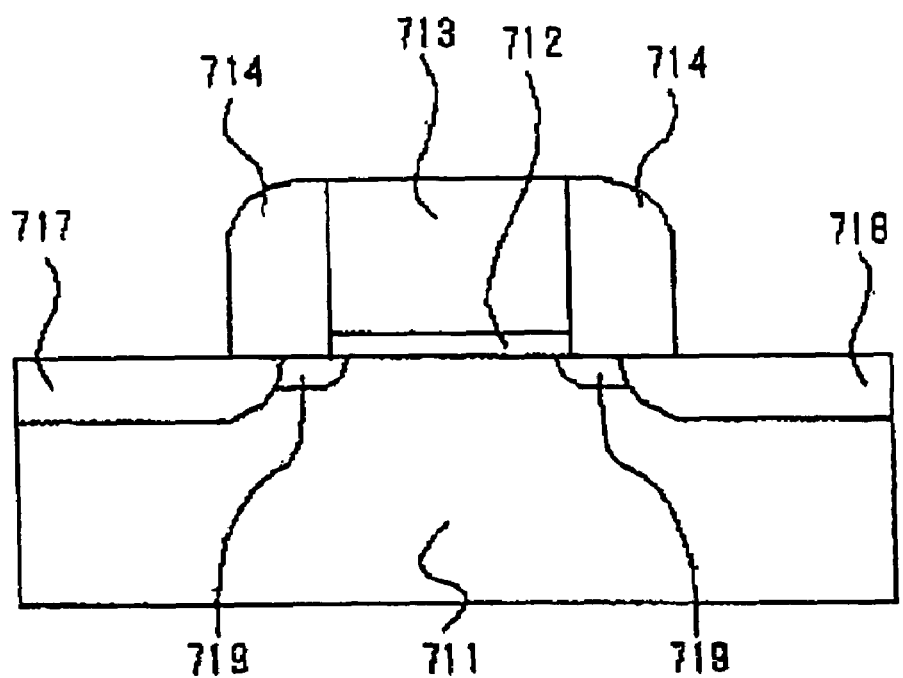
FIG. 25 is a schematic cross-sectional view showing a typical transistor.

A procedure for forming the memory element of Embodiment 10 has a high level of affinity to a typical process for forming a standard transistor. Therefore, a process for producing a semiconductor storage device, i.e., a process for integrating memory elements and logic transistors together, is considerably simplified. Referring to FIG. 25, a standard translator, which is used to constitute a logic circuit portion or an analog circuit portion, typically comprises a semiconductor substrate 711, a gate insulating film 712, a gate electrode 713, a side-wall spacer 714 consisting of an insulating film, a source region 717, and a drain region 718. The gate electrode 713 is provided via the gate insulating film 712 on the semiconductor substrate 711. The side-wall spacer 714 is provided on a side wall of the gate electrode 713. The source region 717 and the drain region 718 are provided on the respective opposite sides of the gate electrode 713. The source region 717 and the drain region 718 each have an LDD (Lightly Doped Drain) region 719. Therefore, the standard transistor has a structure similar to that of a memory element for use in a semiconductor storage device. To change a standard transistor to a memory element, for example, the function of a memory function portion is added to the side-wall spacer 714, and the LDD region 719 is not formed.

More specifically, for example, the side-wall spacer 714 may be modified to have a structure similar to the memory function sections 261 and 262 of FIG. 8. In this case, the ratio of the film thicknesses of the silicon oxide films 241 and 243 and the silicon nitride film 242 can be adjusted as appropriate so as to obtain an appropriate operation of a memory element. Even if the side-wall spacer of a transistor constituting a standard logic portion has a structure similar to that of, for example, the memory function sections 261 and 262 of FIG. 8, the transistor performance cannot be impaired as long as the width of the side-wall spacer (i.e., the total film thickness of the silicon oxide films 241 and 243 and the silicon nitride film 242) is appropriate and the transistor is operated within a voltage range which does not permit a rewrite operation.

The LDD region may be formed in a transistor constituting a standard logic portion by performing impurity implantation for formation of the LDD region after formation of the gate electrode and before formation of the memory function section (side-wall spacer). Therefore, the memory element and the standard translator can be simultaneously formed only by masking the memory element with a photoresist during performing impurity implantation for formation of the LDD region. Thus, the memory elements and the standard transistors can be easily integrated together.

Note that the process for forming a conventional flash memory is significantly different from the process for forming a standard logic circuit. Therefore, as compared with when a flash memory is used as a non-volatile memory and the flash memory and logic circuits or analog circuits are integrated together, the semiconductor storage device of the present invention can dramatically reduce the number of masks and the number of processing steps. Therefore, the yield of a chip having logic circuits or analog circuits along with a non-volatile memory element can be improved, thereby reducing manufacturing cost. As a result, an inexpensive, highly reliable semiconductor storage device can be obtained.

In the semiconductor storage device of Embodiment 10, opposing stored information is preferably stored in two memory elements connected to a single sense amplifier. During a read operation, the sense amplifier is preferably operated to detect a difference between the values of currents passing through the two memory elements. When opposing stored information is stored in two memory elements connected to a single sense amplifier, the reliability of a read operations higher than when a single memory element and an external reference cell are connected to a single sense amplifier. Moreover, a read rate can be improved while a read current value can be reduced. The reason the reliability of a read operation is improved when opposing stored information is stored in two memory elements connected to a single sense amplifier, is described below. The two memory elements can be caused to have the same number of rewrite operations. Therefore, any change in characteristics of the two memory cell due to the deterioration of the memory element is substantially the same between the two memory cells. As a result, a difference between the values of currents passing through the two memory elements is unlikely to be changed. Similarly, the difference between the values of currents passing through the two memory elements is easily maintained to be high, thereby making it possible to improve the read rate. Also, similarly, the value of a read current can be easily reduced by increasing the sensitivity of the sense amplifier. If the value of a read current can be reduced, the density of a memory cell array can be increased by reducing the gate width of each memory element.

In the above-described operation method, opposing stored information is stored in two memory elements connected to a single sense amplifier, and during a read operation, the sense amplifier is operated to detect a difference between the values of currents passing through the two memory elements. This operation method is particularly preferable for the semiconductor storage device of the present invention.

As described in Embodiment 9, the memory element of the present invention can have a particularly high drain current ratio between writing and erase operations. Therefore, it is possible to realize a high-speed read operation by increasing the difference between the values of currents passing through the two memory elements. Even when the gate width of the memory element is reduced, a necessary difference between the current values can be obtained. Therefore, particularly, the density of a memory cell array can be easily improved by reducing the gate width of each memory element.

Note that in two memory elements connected to a single sense amplifier, a rewrite operation may be performed separately in one memory function section (A) and the other memory function section (B) (the operation method described in FIG. 21). In this case, opposing stored information is preferably stored in one memory function section (A), and the other memory function section (B). In this case, two memory calls can-be used to store two bits of information. Note that a structure is required which can reverse the direction of a current passing through a memory element during a read operation.

Alternatively, in two memory elements connected to a single sense amplifier, one memory function section (A) and the other memory function section (B) may have the same memory state (the operation method described in FIG. 22). In this case, two memory cells can be used to store one bit of information. Thus, by causing both memory function sections to have the same memory state, the reliability of a read operation can be further improved.

During a read operation, a drain current sensitively responds to the charge amount of a memory function section closer to the source (source-side memory function section), and is not very sensitive to the charge amount of a memory function section closer to the drain (drain-side memory function section). However, a drain current of a memory element is not completely free from the influence of the charge amount of the drain-side memory function section. The influence results in an interference effect, varying the value of a current to a sense amplifier and increasing the margin of a read current. Therefore, in two memory elements connected to a single sense amplifier, by causing one memory function section (A) and the other memory function section (B) to have the same memory state, the variation of the value of a current input to the sense amplifier can be reduced. As a result, the reliability of a read operation can be improved.

In Embodiment 10, the memory element of Embodiment 7 is preferably used. Specifically, the thickness (T1) of an insulating film separating the charge retaining film (silicon nitride film 242) from the channel region or the well region is preferably smaller than the thickness (T2) of the gate insulating film and is preferably 0.8 nm or more. When such a memory element is used in the semiconductor storage device of Embodiment 10, a voltage required for writing and erase operations can be reduced, or high-speed writing and erase operations can be achieved. In addition, since the memory effect of the memory element is increased, the read rate of the semiconductor storage device can be increased.

In Embodiment 10, the memory element of Embodiment 8 is preferably used. Specifically, the thickness (T1) of an insulating film separating the charge retaining film (silicon nitride film 242) from the channel region or the well region is preferably greater than the thickness (T2) of the gate insulating film, and is preferably 20 nm or less. If such a memory element is used in the semiconductor storage device of Embodiment 10, the ability of retaining a memory can be improved without deteriorating the short channel effect of the memory element. Therefore, even when the scale of integration of a semiconductor storage device is increased, a sufficient ability to retain a memory can be obtained.

As described in Embodiment 2, in a memory element used in Embodiment 10, regions (silicon nitride film 242) for retaining charges in the memory function sections 261 and 262 preferably overlap the diffusion regions 212 and 213, respectively. When such a memory element is used in the semiconductor storage device of Embodiment 10, the read rate of the semiconductor storage device can be sufficiently increased.

As described in Embodiment 2 in a memory element used in Embodiment 10, the memory function section preferably comprises a charge retaining film substantially parallel to a surface of the gate insulating film. When such a memory element is used in the semiconductor storage device of Embodiment 10, the variation of the memory effect of the memory element can be reduced. Therefore, in this case, the variation of a read current in the semiconductor storage device can be suppressed. In addition, a change in characteristics of the memory element retaining a memory can be reduced, thereby improving the memory retaining ability of the semiconductor storage device.

As described in Embodiment 3, in a memory element used in Embodiment 10, the memory function section preferably comprises a charge retaining film substantially parallel to a surface of the gate insulating film, and a portion extending substantially parallel to a side of the gate electrode. When such a memory element is used in the semiconductor storage device of Embodiment 10, the rewriting speed of the memory element is increased. Therefore, the speed of the rewrite operation of the semiconductor storage device can be increased.

The memory element having the best mode as described above is most preferably used in Embodiment 10. Thereby, the best performance of a semiconductor storage device can be obtained.

(Embodiment 11)

A semiconductor storage device according to Embodiment 11 of the present invention is the same as the semiconductor storage device of Embodiment 10, except that a selection transistor to not used.

Figure 23:
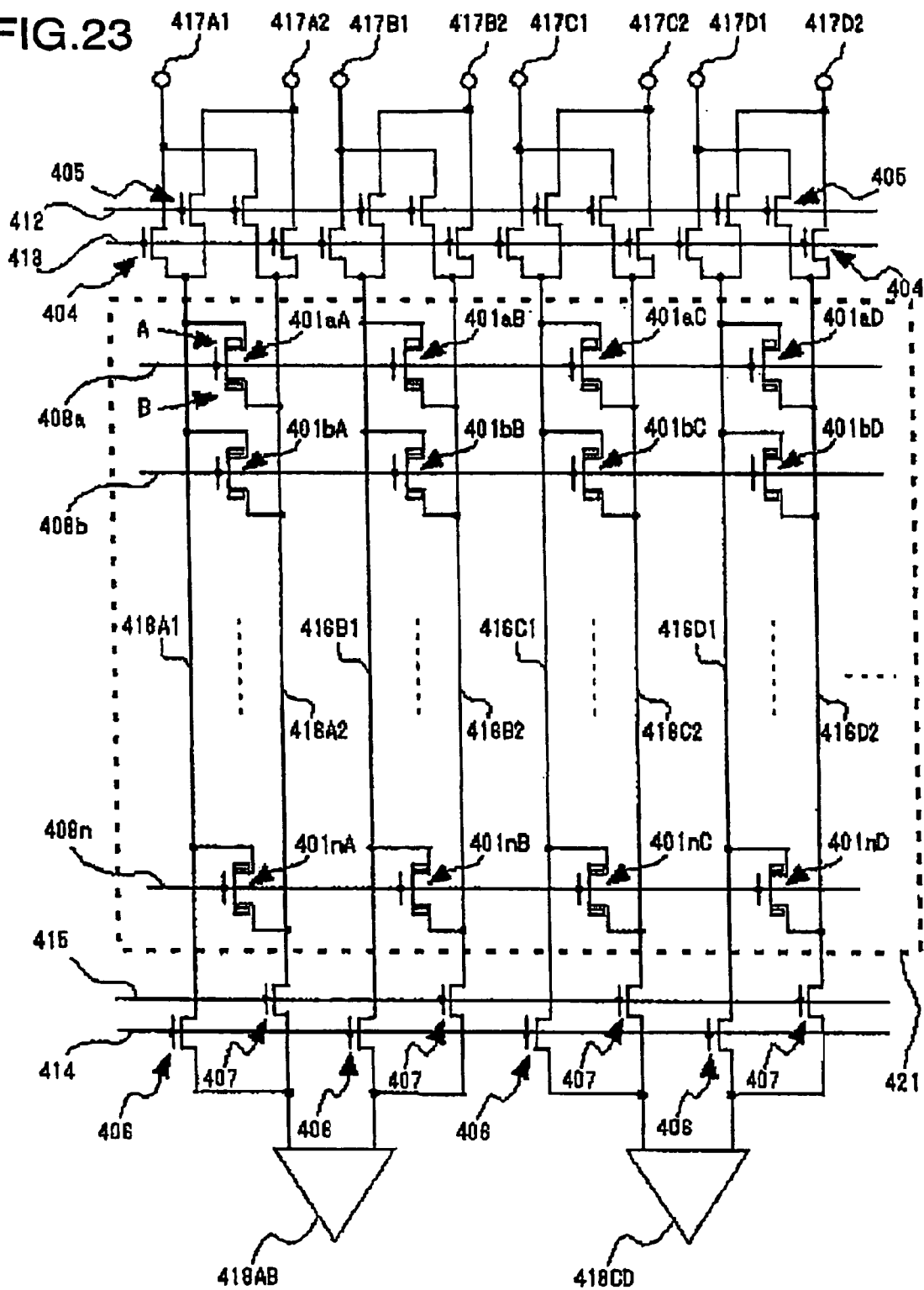
FIG. 23 is a circuit diagram showing a semiconductor storage device according to Embodiment 11 of the present invention.

FIG. 23 is a circuit diagram showing the semiconductor storage device of Embodiment 11. As compared with the semiconductor storage device of FIG. 20, a memory element array region 421 is the only difference. Operation selecting transistors 404 and 405, operation selection lines 412 and 413, first voltage input terminals 417A1 to 417D1, second voltage input terminals 417A2 to 417D4, a first switching transistor 406, a second switching transistor 407, switching transistor selection lines 414 and 415, sense amplifiers 418AB and 418CD, and word lines 408a to 408n are the same as those of the semiconductor storage device of Embodiment 10 (FIG. 20).

Memory elements 401aA to 401aD, . . . , 401nA to 400nD are connected directly to first bit lines 416A1 to 416D1 and second bit lines 416A2 to 416D2, respectively.

A method for operating the semiconductor storage device is similar to that of the semiconductor storage device of Embodiment 10 (FIG. 20). Note that since no selection transistor is used, a rewriting voltage is applied to the source/drain of all memory elements connected to the same bit line pair during a rewrite operation. Therefore, it is necessary to design the memory elements so that any memory element, which is not connected to a selected word line, is not rewritten.

According to the semiconductor storage device of Embodiment 11, the scale of integration can be significantly improved since no selection translator is used. Therefore, the manufacturing cost can be significantly reduced, resulting in an inexpensive semiconductor storage device.

The memory element of the present invention is free from over-erasure, which is a problem with EEPROM. Therefore, the memory element of the present invention is particularly suited for use in a semiconductor storage device which has a plurality of word line and no selection transistor, as in Embodiment 11. This is because when the threshold of a memory element (e.g., the memory element 401aA) is negative due to over-erasure, the first bit line 416A1 to constantly conductive to the second bit line 416A2, and therefore, memory elements connected between these bit lines cannot be selected.

(Embodiment 12)

In a semiconductor storage device according to Embodiment 12 of the present invention, the density of a memory element array region 521 is further increased.

Figure 24:
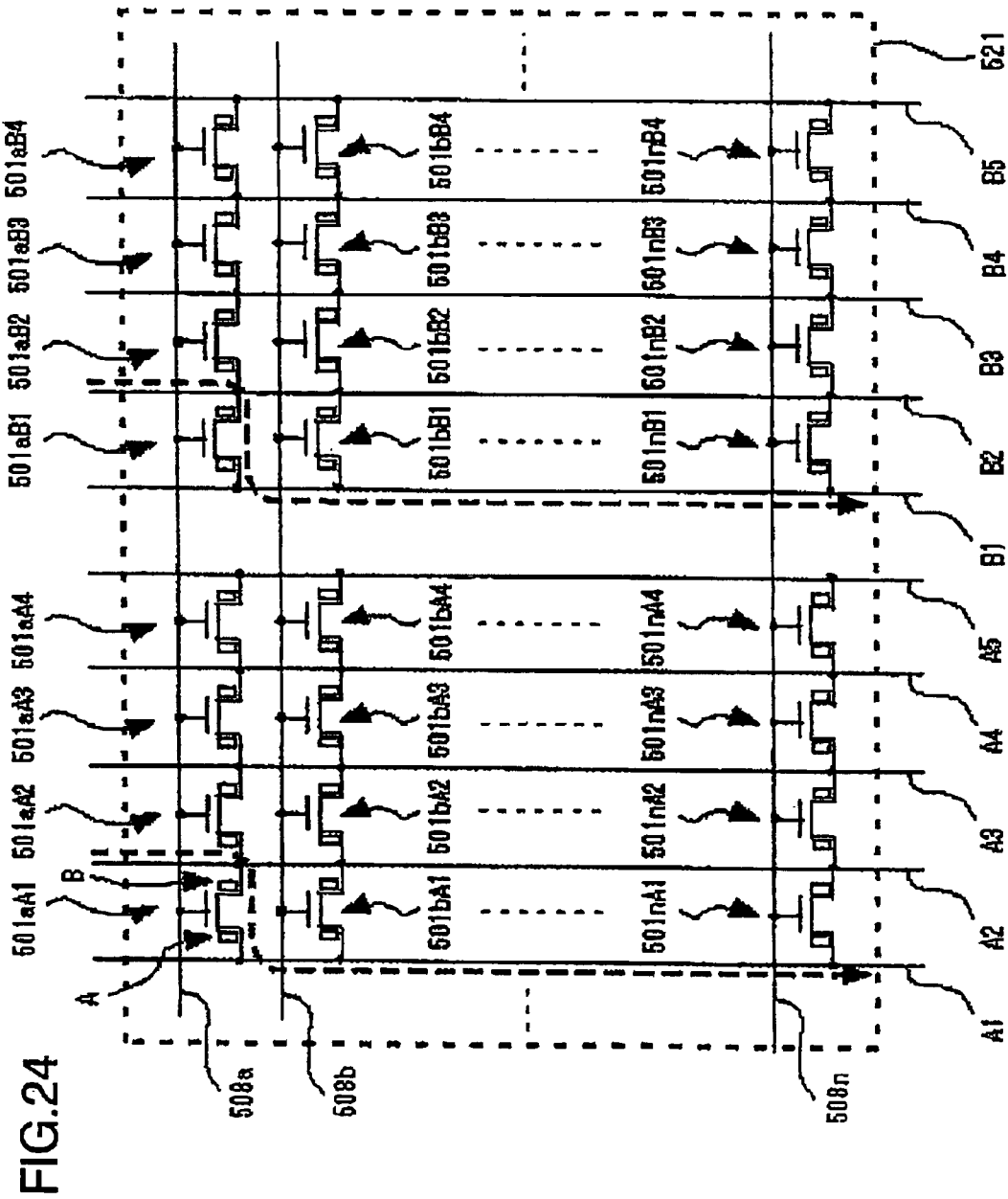
FIG. 24 is a circuit diagram showing a semiconductor storage device according to Embodiment 12 of the present invention.

In FIG. 24, reference numerals 501aA1 to 501aA4, 501aB1 to 501aB4, . . . , and 501nB1 to 501nB4 indicate memory elements, 508a to 508n indicate word lines, and A1 to A5 and B1 to D5 indicate bit lines. The memory element array region 521 of the semiconductor storage device of Embodiment 12 is different from that of Embodiments 10 and 11 in that a bit line is shared by memory elements arranged on two neighboring lines. Specifically, bit lines A2 to A4 and B2 to B4 are shared. In Embodiment 12, memory elements on four lines constitute one block. The present invention is not limited to such a number of lines.

In the semiconductor storage device, a read operation is performed as follows. Currents passing through two respective memory elements belonging to different blocks (e.g., memory elements 501aA1 and 501bB1) are supplied to one and the other inputs of a sense amplifier, respectively to detect a difference between the current. In this case, for example, one input of the sense amplifier is connected to a bit line A1, while the other input is connected to a bit line B1. In addition, a voltage (e.g., +1.8 V) appropriate for a read operation is applied to the bit lines A2 and B2. Paths of currents flowing in this situation are indicated by dashed lines with an arrow in FIG. 24. The currents passing through these paths are supplied to the two inputs of a sense amplifier, respectively, and a difference between the currents is detected. Note that circuits connecting memory elements with voltage input terminals and sense amplifiers, and the like, are not shown in FIG. 24.

According to the semiconductor storage device of Embodiment 12, a bit line is shared by memory elements arranged in two neighboring lines, thereby making it possible to significantly improve the scale of integration. Therefore, the manufacturing cost is significantly reduced, resulting in an inexpensive semiconductor storage device.

(Embodiment 13)

Embodiment 13 relates to a semiconductor storage device comprising a memory array capable of performing program and erase operations.

Figure 26:
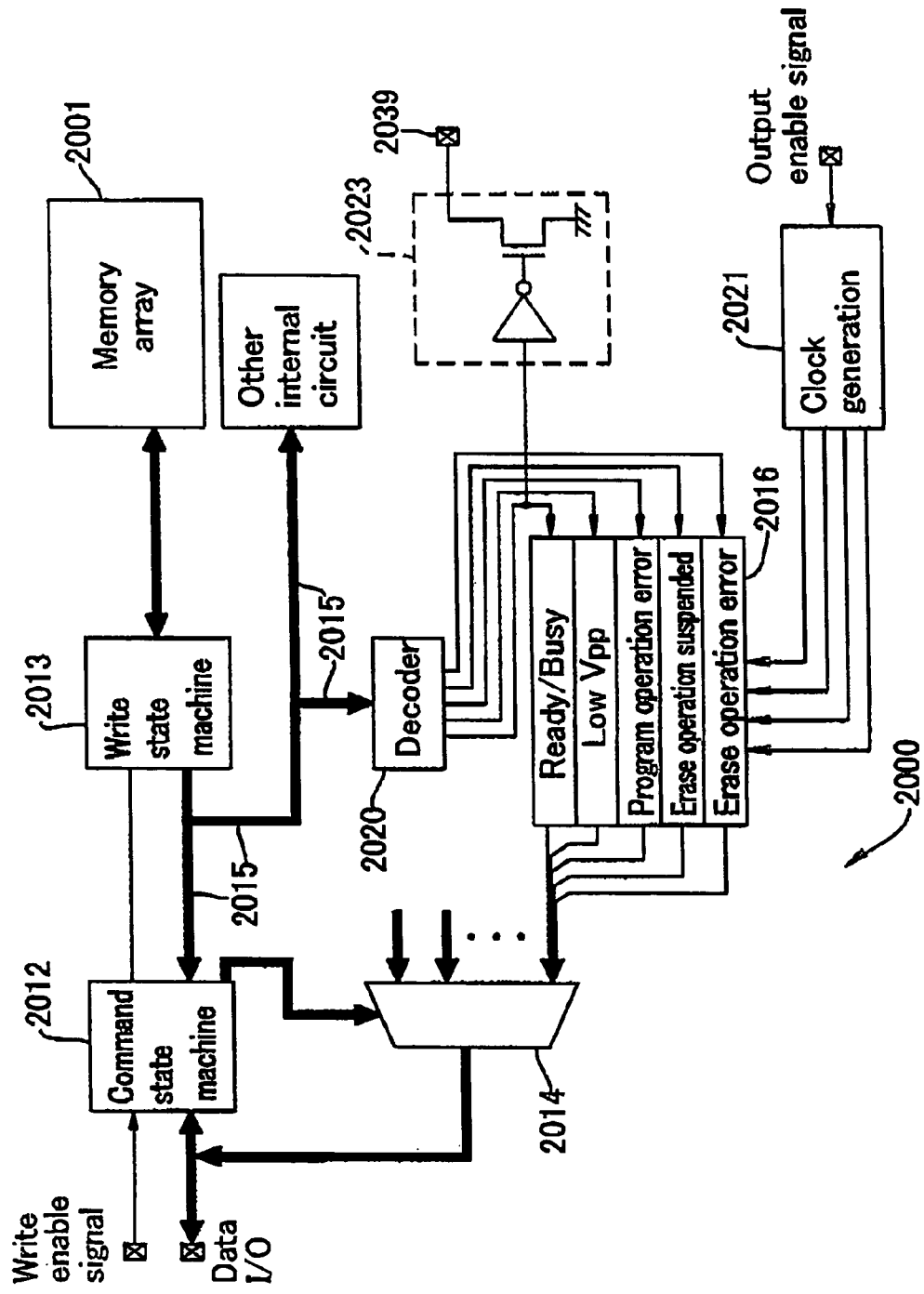
FIG. 26 is a circuit diagram showing a semiconductor storage device according to Embodiment 13 of the present invention.

FIG. 26 shows an exemplary configuration of a semiconductor storage device 2000 according to Embodiment 13 of the present invention. The semiconductor storage device 2000 comprises a memory array 2001.

As the memory array 2001, for example, a memory array as described in Embodiments 10 to 12 can be used. Though not shown in FIG. 26, the memory array 2001 comprises a memory element array region, in which a plurality of memory elements are arranged, a circuit portion for applying a prescribed write or read voltage to each memory element, a sense amplifier, and a circuit portion connecting the sense amplifier and the memory element.

A memory element as described in Embodiments 1 to 9 can be used in the memory array 2001. Specifically, any memory element can be used, which comprises a gate electrode provided via a gate insulating film an a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges.

The semiconductor storage device 2000 further comprises a command state machine (CSM) 2012 and a write state machine (WSM) 2013.

The command state machine 2012 functions as an interface between a programmer (user) and the memory array 2001. The command state machine 2012 limits commands, which are presented to the memory array 2001, to a specific set of commands which are permitted to be supplied in specific conditions of the memory array 2001. As a result, only commands permitted by the command state machine 2012 are supplied to the memory array 2001. As a result, it is possible to eliminate a programming error which might harm the memory array 2001 or its associated peripheral circuitry. A program operation and an erase operation with respect to the memory array 2001 are controlled by the command state machine 2012 via the write state machine 2013. The write state machine 2013 performs a sequence of a program operation or an erase operation with respect to the memory array 2001.

The command state machine 2012 monitors all input commands and allows access to the write state machine 2013 only when the write state machine 2013 is not either programming the memory array 2001 or erasing the array. If the write state machine 2013 is engaged in either of these operations with respect to the memory array 2001, access to the write state machine 2013 is precluded by the command state machine 2012.

In order to assure that this control (allowance/preclusion) occurs, the write state machine 2013 outputs a state signal, which indicates a current state of the write state machine 2013, to the command state machine 2012 and other internal circuits via a state bus 2015. The state bus 2015 is, for example, a 7-bit bus line. By referencing the state signal on the state bus 2015, the command state machine 2012 can know the current state of the write state machine 2013.

The semiconductor storage device 2000 further comprises a decoder 2020 connected to the state bus 2015, a status register 2016 for storing a signal output from the decoder 2020 (i.e., a status signal indicating the status of a program operation or an erase operation with respect to the memory array 2001), and an output circuit 2014 for outputting a status signal stored in the status register 2016. In the example shown in FIG. 26, the output circuit 2014 is a multiplexer. The present invention is not limited to this.

The decoder 2020 decodes a state signal (e.g., a 7-bit signal) on the state bus 2015, which is output by the write state machine 2013, to output the status signal (e.g., a 5-bit signal) indicating the status of a program operation or an erase operation with respect to the memory array 2001.

In the example shown in FIG. 26, the 5-bit status signal is stored in the status register 2016. Each bit of the 5-bit status signal has a value of "0" or "1". In this example, the first bit of the status signal indicates that an erase operation with respect to the memory array 2001 has failed; the second bit of the status signal indicates that an erase operation with respect to the memory array 2001 is suspended; the third bit of the status signal indicates that a program operation with respect to the memory array 2001 has failed; the fourth bit of the status signal indicates that a voltage Vpp is not sufficient for a program operation or an erase operation with respect to the memory array 2001; and the fifth bit of the status signal indicates that the write state machine 2013 is busy or ready. The term "busy" refers to a state when the write state machine 2013 is either programming the memory array 2001 or erasing the array. The term "ready" refers to a state when the write state machine 2013 is ready to either program the memory array 2001 or erase the array.

The status register 2016 comprises, for example, five two-stage master-slave latches. The five individual latches store the individual bits of the status signal. The master-slave latch has the same structure as that of a latch shown in FIG. 27 as a part of the decoder 2020. An output enable signal OEB is supplied to a clock generator 2021. In response to the output enable signal OEB, the clock generator 2021 generates master and slave signals for clocking the individual bits of the status signal stored in the status register 2016. In response to a clock signal from the clock generator 2021, the status register 2016 outputs the individual bits of the status signal to a multiplexer 2014.

The multiplexer 2014 is controlled by the command state machine 2012. The multiplexer 2014 is used to transfer various information out of the semiconductor storage device 2000. For example, the command state machine 2012 controls the multiplexer 2014 to transfer the status signal stored in the status register 2016 to circuitry external to the semiconductor storage device 2001 (e.g., a processor). Alternatively, the command state machine 2012 may control the multiplexer 2014 to transfer data read from the memory array 2001 to circuitry external to the semiconductor storage device 2001. Alternatively, the command state machine 2012 controls the multiplexer 2014 to transfer data specifying the hardware structure of the memory array 2001 (e.g., manufacturer, type, model, etc.) to circuitry external to the semiconductor storage device 2001.

A signal (ready/busy signal) indicating whether the write state machine 2013 is busy or ready, is output from a terminal 2039 via a driver circuit 2023. The driver circuit 2023 comprises, for example, an inverter and a large capacity N channel FET. The output of the inverter is connected to the gate of the N channel FET (FIG. 26). Depending on the state of the ready/busy signal, either a ground voltage is applied to the terminal 2039 or the terminal 2039 is in a high impedance state (Hi-Z). Therefore, it to possible to inform circuitry (e.g., a processor) external to the semiconductor storage device 2000, whether the write state machine 2013 is busy or ready. For example, when the write state machine 2013 transitions from the busy state to the ready state, an interrupt signal may be generated and transferred to the processor. In this case, the processor gives a command to the write state machine 2013, and thereafter, performs another operation without waiting for the end of the operation based on the command. As a result, it is possible to prevent the occurrence of delay in an operation of the processor or other system components, thereby increasing the operating speed of the whole system.

Figure 27:
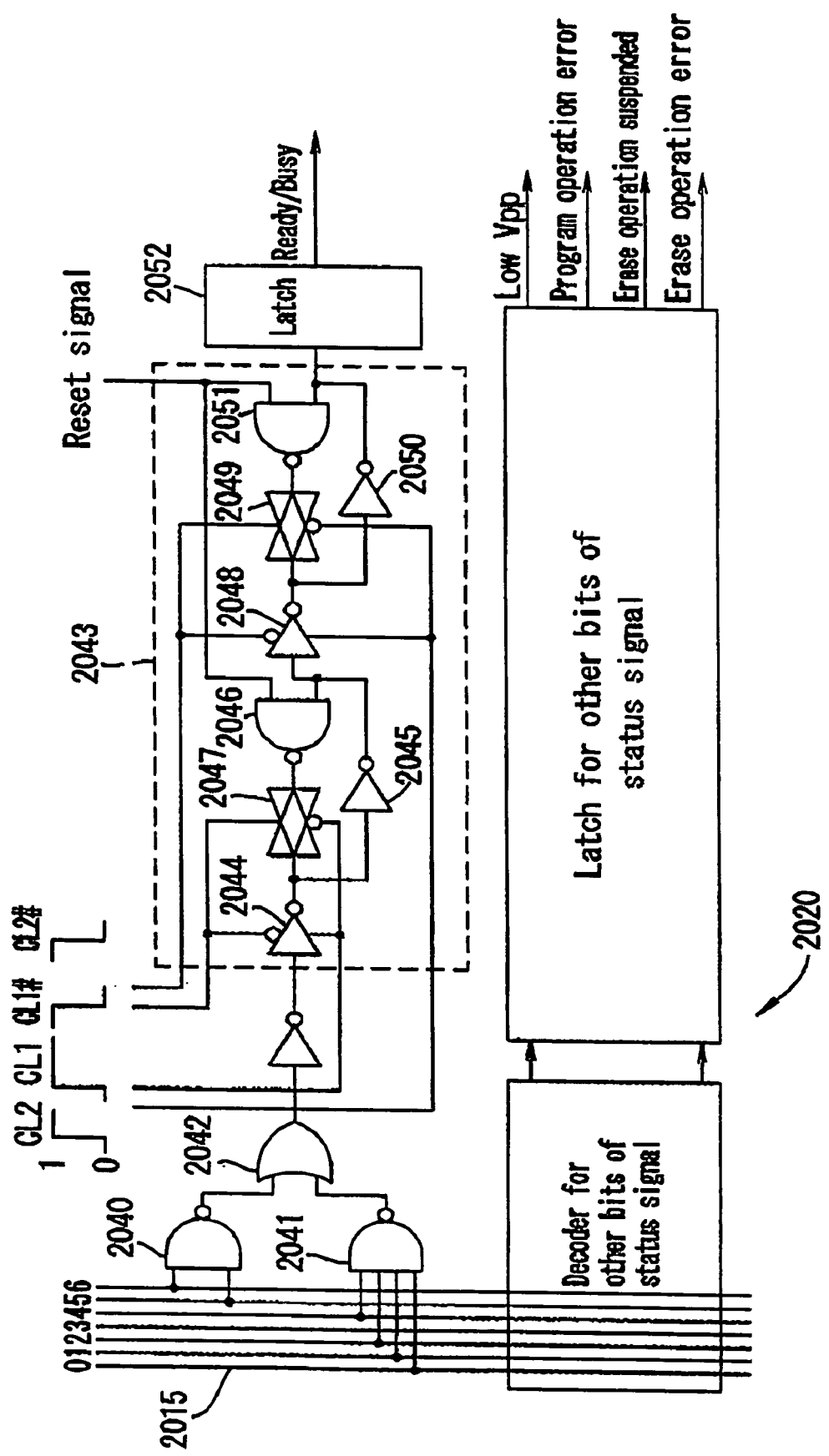
FIG. 27 is a circuit diagram showing a decoder in the semiconductor storage device of Embodiment 13.

FIG. 27 shows an exemplary configuration of the decoder 2020.

The decoder 2020 comprises a circuitry for generating a ready/busy signal (comprising a pair of NAND gates 2040 and 2041, an OR gate 2042, a latch 2043, and a latch 2052), and a circuitry for generating a status signal other than the ready/buoy signal. The circuitry for generating a status signal other than the ready/busy signal has a similar configuration to that of the circuitry for generating the ready/buoy signal, and therefore, is not herein explained.

A pair of NAND gates 2040 and 2041 are connected to specified wires of seven wires [0:6] of the state bus 2015. For example, a signal pattern in which the wire 0 carries a value "1", while the wires 1, 2 and 4 to 6 carry a value "0", indicates that the write state machine 2013 is in the ready state (i.e., can receive a command to program or erase from the command state machine 2012). When the pair of NAND gates 2040 and 2041 receive the signal pattern, the NAND gates 2040 and 2041 each output a value "1". Therefore, the OR circuit 2042 also outputs a value "1".

The latch 2043 receives an input signal at an input terminal of a tristate inverter 2044, the input to the master stage of the latch 2043. Four clock signals CL1, CL1#, CL2, and CL2# are input to the latch 2043. The four clock signals may be generated by, for example, the clock generator 2021 (FIG. 26).

The clock signal CL1 and its complementary signal CL1# turn on the tristate inverter 2044, and invert and transfer a signal input to the input terminal to the output terminal. The inverted signal is supplied by an inverter 2045 to one input terminal of the NAND gate 2046. A reset signal is supplied to the other input terminal of the NAND gate 2046. Since the value of the reset signal is typically "1", the NAND gate 2046 inverts whatever signal is output from the inverter 2045. As a result, the same signal is applied to both sides of a transmission gate 2047. The transmission gate 2047 comprises an N channel FET and a P channel FET with their source terminals and drain terminals connected and their gate terminals arranged to receive opposite values of the same enable signal (in this example, the clock signals CL1 and CL1#). Such a transmission gate is well known.

Thus, when the ready signal is first transferred by the tristate inverter 2044, the transmission gate 2047 is not turned on. However, when the clock signal CL1 goes low to turn off the tristate inverter 2044, the transmission gate 2047 is turned on. As a result, the state of the ready signal is stored and supplied to one input terminal of the tristate inverter 2048 of the slave portion of the latch 2043.

The tristate inverter 2048 is turned on by the clock signal CL2 going high. As a result, the signal input to the input terminal of the tristate inverter 2048 is transferred to one side of the transmission gate 2049, and via an inverter 2050 to an input terminal of a NAND gate 2051. Therefore, the same signal 10 applied to opposite sides of the transmission gate 2049 which to initially off. When the clock signal CL2 goes low, the transmission gate 2049 is turned on. As a result, the input signal is stored and supplied to the input terminal of the latch 2052. The latch 2052 has the same structure as that of the latch 2043. The latch 2052 performs two-stage transfer of the signal input to the input terminal. As a result, a ready/busy signal is output from the output terminal of the latch 2052.

According to the semiconductor storage device 2000 of Embodiment 13, a statue signal indicating a status of a program operation or an erase operation with respect to the memory array 2001 (e.g., whether or not a program operation or an erase operation is successful) is stored in the status register 2016, and the status signal stored in the status register 2016 is output. As a result, it is possible to inform the user (external to a chip carrying the semiconductor storage device) of the status of a program operation or an erase operation with respect to the memory array 2001. As a result, the user can determine whether or not the same operation is performed again when a program operation or an erase operation has failed.

(Embodiment 14)

Figure 28:
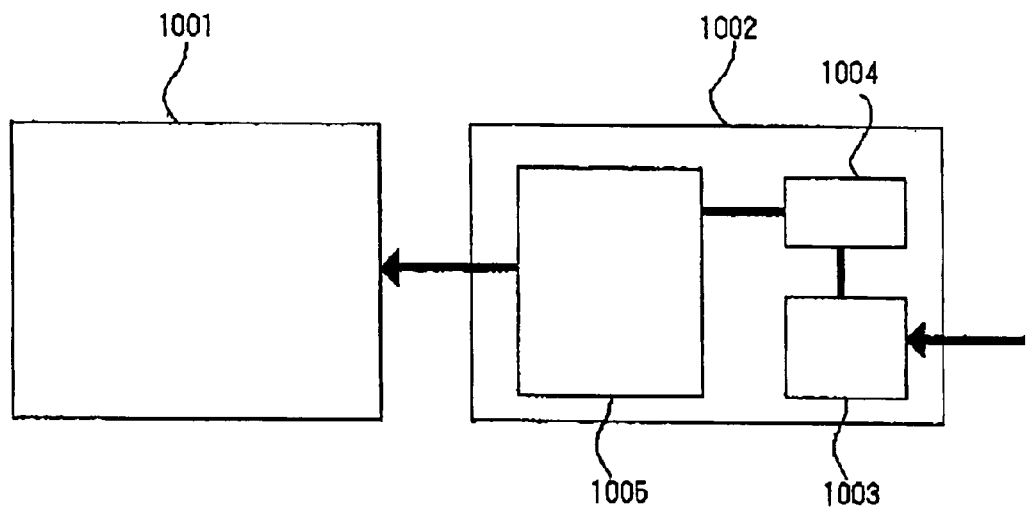
FIG. 28 is a schematic diagram showing a configuration of a liquid crystal display apparatus according to Embodiment 14 of the present invention, comprising a semiconductor storage device of the present invention.

The above-described semiconductor storage device may be applied to, for example, a rewritable non-volatile memory for adjusting an image on a liquid crystal panel as shown in FIG. 28.

A liquid crystal panel 1001 is driven by a liquid crystal driver 1002. The liquid crystal driver 1002 comprises a non-volatile memory portion 1003, an SRAM portion 1004, and a liquid crystal driver circuit 1005. The non-volatile memory portion comprises the memory element of the present invention, more preferably a semiconductor storage device according to any one of Embodiments 10 to 12. The non-volatile memory portion 1003 can be externally rewritten.

Information stored in the non-volatile memory portion 1003 is transcribed into the SRAM portion 1004 when the power of the apparatus to turned ON. The liquid crystal driver circuit 1005 can read information stored in the SRAM portion 1004 if required. By providing the SRAM portion 1004, the stored information can be read with high speed.

The liquid crystal driver 1002 may be provided external to the liquid crystal panel 1001 as shown in FIG. 28, or alternatively, may be provided on the liquid crystal panel 1001.

Liquid crystal panels display gray scale images, which are varied by applying multiple levels of voltages to each pixel. Generally, there are variations among products in the correspondence between applied voltages and displayed gray levels. To address this problem, information for compensating for variations in individual products is stored after completion of the product, and based on the information, compensation is performed. Thereby, image quality can be made uniform among products. Therefore, a rewritable non-volatile memory for storing correction information is preferably carried on the product. As the non-volatile memory, the memory element of the present invention is preferably used, particularly a semiconductor storage device according to any one of Embodiments 10 to 12, with which the memory elements of the present invention are integrated.

When the memory element of the present invention is used an a non-volatile memory for adjusting an image on a liquid crystal panel, a process for integrating it with a circuit, such as a liquid crystal driver or the like, can be easily achieved, leading to a reduction in manufacturing cost. The semiconductor storage devices of Embodiments 10 to 12 are particularly suitable when a memory size is relatively small and the reliability or stability is valued. This is because the outputs of two memory elements (memory element pair) are input to the same sense amplifier, so that a difference between currents passing through the two memory elements having similar device structures can be detected, thereby performing a read operation reliably and stably. Therefore, an area per bit is large. However, when a memory size is small, the large area per bit of the semiconductor storage device can be accepted as compared to the areas of other circuits. A typical non-volatile memory for adjusting an image on a liquid crystal panel has a size of, for example, several kilobytes, i.e., a relatively small memory size. Therefore, the semiconductor storage devices of Embodiments 10 to 12 are particularly preferably used as non-volatile memories for adjusting an image on a liquid crystal panel.

(Embodiment 15)

Figure 29:
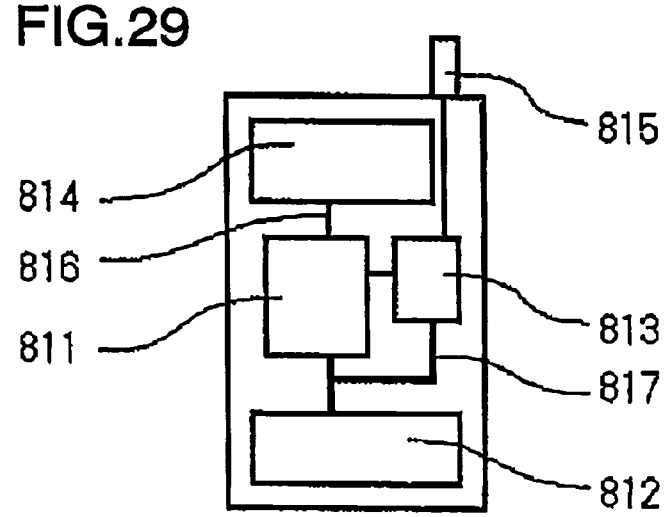
FIG. 29 is a schematic diagram showing a configuration of a mobile electronic apparatus according to Embodiment 15 of the present invention, comprising a semiconductor storage device of the present invention.
Figure 30:
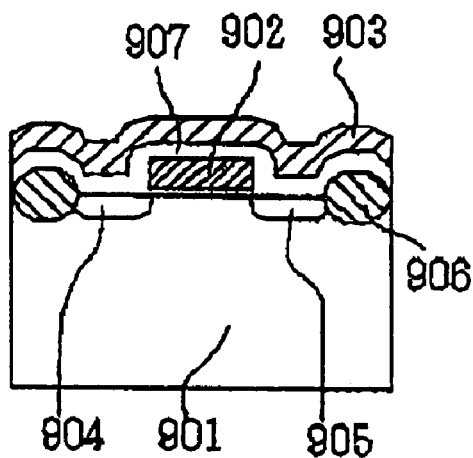
FIG. 30 is a schematic cross-sectional view showing a conventional flash memory.

A mobile telephone, which is a mobile electronic apparatus comprising the above-described semiconductor storage device, is shown in FIG. 29.

The mobile telephone comprises a control circuit 811, a battery 812, an RF (radio frequency) circuit 813, a display portion 814, an antenna 815, a signal line 816, a power supply line 817, and the like. The control circuit 811 comprises the above-described semiconductor storage device of the present invention. Note that the control circuit 811 may be preferably an integrated circuit in which elements having the same structure as described in Embodiment 10 are used both as memory circuit elements and as logic circuit elements. As a result, the manufacture of integrated circuits can be facilitated, leading to a reduction in the manufacturing cost of mobile electronic apparatuses.

As described above, by using a semiconductor storage device in a mobile electronic apparatus, in which a memory portion and a logic circuit portion can be easily integrated together and a high-speed read operation can be obtained, the operation speed of the mobile electronic apparatus can be increased and the manufacturing cost can be reduced. Therefore, it is possible to obtain an inexpensive, highly reliable, high-performance mobile electronic apparatus.

According to the semiconductor storage device of the present invention, a status signal indicating the status of a program operation or an erase operation with respect to a memory array is stored in a statue register. The status signal is output from the status register. Thereby, the user can be informed of the status of a program operation or an erase operation with respect to a memory array. As a result, when a program operation or an erase operation fails, the user can determine whether to perform the same operation.

Each memory element in a memory array contained in the semiconductor storage device according to the present invention comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges. Therefore, the memory element can be formed by a process having high affinity to a standard process for typical transistors. Therefore, as compared with when a conventional flash memory is used as a non-volatile memory element and the flash memory and a peripheral circuit comprising a typical transistor are integrated together, the semiconductor storage device of the present invention can dramatically reduce the number of masks and the number of processing steps. Therefore, the yield of a chip can be improved, thereby reducing manufacturing cost.

At least a portion of a memory function section of the memory element preferably overlaps a portion of a diffusion region. In this case, a write operation can be performed at a low voltage without an auxiliary gate. As a result, power consumption during a program operation can be reduced.

The memory function section of the memory element preferably comprises a charge retaining film having a surface substantially parallel to a surface of the gate electrode insulating film and having a function of retaining charges. Thereby, variations in the memory effect can be suppressed, leading to an increase in the probability of success in a rewrite operation. Therefore, the maximum pulse value can be set to be smaller than in conventional techniques, thereby making it possible to complete a rewrite operation quickly and reduce the possibility of occurrence of a failure in a rewrite operation.

A semiconductor layer of the memory element preferably has a region in a vicinity of a diffusion region, which has a concentration higher than that of a vicinity of a surface of the semiconductor layer under the gate electrode. Thereby, a memory effect (i.e., a difference in threshold between a write operation and an erase operation) is enhanced. The memory element preferably comprises a charge retaining film for retaining charges, which has a surface substantially parallel to a surface of the gate insulating film, and an insulating film separating the charge retaining film from a channel region or a semiconductor layer. The thickness of the insulating film to smaller than that of the gate insulating film, and is preferably 0.8 nm or more. As a result, the amount of charges induced in the channel region or the well region is increased, thereby enhancing the memory effect.

Thus, the memory element of the present invention has a memory effect greater than that of conventional flash memories. Therefore, it is possible to obtain a greater design margin for determining whether the memory element is in the program (write) state or the erase state, thereby increasing the probability of a successful rewrite operation. As a result, the value of a maximum pulse can be set to be smaller than that of conventional techniques. Therefore, a rewrite operation can be completed quickly. Moreover, the possibility that an error occurs in a rewrite operation is reduced.

A memory function section of the memory element preferably comprises a charge retaining film having a function of retaining charges. The charge retaining film preferably extends substantially parallel to a side of the gate electrode. As a result, the rewriting rate is increased. A semiconductor layer of the memory element preferably is a region in a vicinity of a diffusion region, which has a concentration higher than that of a vicinity of a surface of the semiconductor layer under the gate electrode. Therefore, the rewriting rate is increased. The memory element comprises a charge retaining film for retaining charges, which has a surface substantially parallel to a surface of the gate insulating film, and an insulating film separating the charge retaining film from a channel region or a semiconductor layer. The thickness of the insulating film is smaller than that of the gate insulating film, and is preferably 0.8 nm or more. Thereby, it is made easier to implant charges into the memory function section. As a result, the rewriting rate is increased.

Thus, the memory element of the present invention has a rewriting rate higher than that of conventional flash memories. Therefore, a rewrite operation can be completed quickly as compared to when the rewriting procedure described in the embodiment above is applied to conventional flash memories.

At least a portion of a memory function section of the memory element preferably overlaps a portion of a diffusion region. In addition, the memory function section of the memory element comprises a charge retaining film having a function of retaining charges. The charge retaining film is preferably an insulating film. Thereby, problems (i.e., a write operation cannot be performed with an effective voltage and time period) caused due to lack of an auxiliary gate can be overcome while maintaining ease of miniaturization, ease of process, and high yield. Moreover, a write voltage can be reduced.

According to a mobile electronic apparatus according to the present invention, the above-described semiconductor storage device is provided therein. Therefore, it is easy to integrate a memory portion and a logic circuit portion together. Thereby, the operating speed of the mobile electronic apparatus can be improved, resulting in a reduction in manufacturing cost. As a result, an inexpensive, highly reliable, mobile electronic apparatus can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor storage device, comprising:
    a memory array comprising a plurality of memory elements;
    a write state machine for performing a sequence of a program operation or an erase operation with respect to the memory array;
    a decoder for decoding a signal indicating a current state of the write state machine, which is output from the write state machine, and outputting a status signal indicating a status of the program operation or the erase operation with respect to the memory array;
    a status register for storing the status signal; and
    an output circuit for outputting the status signal stored in the status register,
    wherein each of the plurality of memory elements comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges.

2. A semiconductor storage device according to claim 1, wherein at least a portion of the memory function section of the memory element overlaps a portion of the diffusion region.

3. A semiconductor storage device according to claim 2, wherein the overlap portion of the memory function section and the diffusion region is greater than 10 nm.

4. A semiconductor storage device according to claim 1, wherein the memory function section of the memory element comprises a charge retaining film having a function of retaining charges, the charge retaining film having a surface substantially parallel to a surface of the gate electrode.

5. A semiconductor storage device according to claim 1, wherein the memory function section of the memory element comprises a charge retaining film having a function of retaining charges, the charge retaining film extending substantially parallel to a side of the gate electrode.

6. A semiconductor storage device according to claim 1, wherein the semiconductor layer of the memory element has a region in a vicinity of the diffusion region, the region having an impurity concentration higher than that of a vicinity of a surface of the semiconductor layer under the gate electrode.

7. A semiconductor storage device according to claim 1, wherein the memory element comprises:
- a charge retaining film having a function of retaining charges, the charge retaining film having a surface substantially parallel to a surface of the gate insulating film; and
- an insulating film separating the charge retaining film from a channel region or a semiconductor layer, the thickness of the insulating film being smaller than that of the gate insulating film and being 0.8 nm or more.

8. A semiconductor storage device according to claim 1, wherein at least a portion of the memory function section of the memory element overlaps a portion of the diffusion region, the memory function section of the memory element comprises a charge retaining film having a function of retaining charges, and the charge retaining film is an insulating film.

9. A mobile electronic apparatus, comprising a semiconductor storage device according to claim 1.

10. A semiconductor storage device according to claim 1, wherein each diffusion region has an offset from a corresponding end of the gate electrode.

11. A semiconductor storage device according to claim 10, wherein a distance between each diffusion region and the corresponding end of the gate electrode is less than 100 nm.

12. A semiconductor storage device according to claim 10, wherein the program or erase operation to one of the memory function sections selected can be executed independently from the other non-selected memory function section by controlling each voltage applied to the diffusion regions and the gate electrode.

* * * * *